(12) United States Patent
Tamura et al.

(10) Patent No.: US 7,446,828 B2
(45) Date of Patent: Nov. 4, 2008

(54) OPTICAL GUIDE AND SURFACE LIGHT EMITTING APPARATUS USING THE SAME

(75) Inventors: Yuuki Tamura, Anan (JP); Jun Omura, Tokushima (JP); Taku Ichimori, Tokushima (JP)

(73) Assignee: Nichia Corporation, Anan (JP)

( * ) Notice: Subject to any disclaimer, the term of this patent is extended or adjusted under 35 U.S.C. 154(b) by 52 days.

(21) Appl. No.: 11/315,358

(22) Filed: Dec. 23, 2005

(65) Prior Publication Data

US 2006/0181902 A1 Aug. 17, 2006

(30) Foreign Application Priority Data

Dec. 27, 2004 (JP) ............ P 2004-377656
Sep. 5, 2005 (JP) ............ P 2005-256534

(51) Int. Cl.
G02F 1/1335 (2006.01)
G02B 6/26 (2006.01)
G02B 6/34 (2006.01)

(52) U.S. Cl. .............. 349/64; 385/18; 385/36
(58) Field of Classification Search ........... 349/64; 385/18, 36

See application file for complete search history.

(56) References Cited

U.S. PATENT DOCUMENTS

| | | | | |
|---|---|---|---|---|
| 6,607,281 | B2 * | 8/2003 | Ono et al. | 362/604 |
| 6,669,350 | B2 * | 12/2003 | Yamashita et al. | 362/612 |
| 6,669,356 | B2 * | 12/2003 | Okuno | 362/311 |
| 6,676,268 | B2 * | 1/2004 | Ohkawa | 362/613 |
| 6,827,458 | B2 * | 12/2004 | Suga | 362/609 |
| 7,004,610 | B2 * | 2/2006 | Yamashita et al. | 362/606 |
| 7,088,333 | B1 * | 8/2006 | Manabe et al. | 345/102 |
| 7,121,709 | B2 * | 10/2006 | Shinohara et al. | 362/606 |
| 7,153,017 | B2 * | 12/2006 | Yamashita et al. | 362/606 |
| 2002/0163790 | A1 * | 11/2002 | Yamashita et al. | 362/31 |
| 2003/0058381 | A1 | 3/2003 | Shinohara et al. | |
| 2003/0214818 | A1 | 11/2003 | Ehara et al. | |
| 2004/0012945 | A1 * | 1/2004 | Yamashita et al. | 362/31 |
| 2004/0022050 | A1 * | 2/2004 | Yamashita et al. | 362/31 |
| 2004/0071437 | A1 | 4/2004 | Tamura et al. | |
| 2004/0076396 | A1 * | 4/2004 | Suga | 385/146 |
| 2004/0090180 | A1 * | 5/2004 | Shimizu et al. | 313/512 |

(Continued)

FOREIGN PATENT DOCUMENTS

JP 9-113907 A 5/1997

(Continued)

*Primary Examiner*—K. Cyrus Kianni
(74) *Attorney, Agent, or Firm*—Birch, Stewart, Kolasch & Birch, LLP

(57) ABSTRACT

A light emitting apparatus that is capable of emitting light with uniform intensity and high luminance are provided. The first optical guide comprises a first principal surface that has an effective light emitting region of substantially rectangular shape surrounded by first through fourth sides and a second principal surface that opposes the first principal surface, wherein the circumferential side face of the optical guide includes first through fourth side faces disposed along the first through fourth sides, respectively, and a light introducing section, disposed at the corner interposed between the first and second side faces, with an angle of inclination from the first side face that is determined so that center axis of light distribution intersects one of the first through fourth sides and divides the area of the effective light emitting region into two equal parts.

4 Claims, 21 Drawing Sheets

U.S. PATENT DOCUMENTS

| | | | |
|---|---|---|---|
| 2004/0183774 A1* | 9/2004 | Manabe et al. | 345/102 |
| 2005/0082974 A1* | 4/2005 | Fukasawa et al. | 313/512 |
| 2005/0094295 A1* | 5/2005 | Yamashita et al. | 359/833 |
| 2005/0254771 A1* | 11/2005 | Yamashita et al. | 385/146 |
| 2006/0001036 A1* | 1/2006 | Jacob et al. | 257/98 |
| 2006/0152827 A1* | 7/2006 | Yamashita et al. | 359/838 |
| 2006/0181897 A1* | 8/2006 | Ueno et al. | 362/600 |
| 2006/0250817 A1* | 11/2006 | Yamashita et al. | 362/606 |
| 2006/0268571 A1* | 11/2006 | Harada et al. | 362/607 |
| 2006/0285324 A1* | 12/2006 | Ansems et al. | 362/231 |

FOREIGN PATENT DOCUMENTS

| | | |
|---|---|---|
| JP | 10-223021 A | 8/1998 |
| JP | 2000-36208 A | 2/2000 |
| JP | 2000-260217 A | 9/2000 |
| JP | 2001-357714 A | 12/2001 |
| JP | 2002-157910 A | 5/2002 |
| JP | 2004-4225 A | 1/2004 |
| JP | 2004-171809 A | 6/2004 |
| JP | 2004-199958 A | 7/2004 |

* cited by examiner 13　　15　16　　17

US 7,446,828 B2

OPTICAL GUIDE AND SURFACE LIGHT EMITTING APPARATUS USING THE SAME

TECHNICAL FIELD

The present invention relates to an optical guide that lets incident light emerge from a predetermined light emerging surface, and a surface light emitting apparatus that combines the optical guide and a point light source.

BACKGROUND ART

In recent years surface light emitting apparatuses have been used as the backlight of liquid crystal display, the surface light emitting apparatus having such a constitution as light emitted by a light emitting diode enters a plate-shaped optical guide through a side face thereof and emerges from a principal surface of the optical guide in surface emitting operation.

In the surface light emitting apparatus, light emitted by the light emitting diode is introduced into a plate-shaped optical guide through a side face thereof and is emitted through a predetermined light emission observing surface by making use of reflection in the optical guide. The light emitting diode used as the light source is typically mounted in plurality on a substrate whereon electrical conductors are wired to supply power, with the light emitting surface of the light emitting diode disposed so as to oppose the side face of the optical guide.

Moreover, in the recent trend toward higher luminance of the light emitting diode, it is made possible to reduce the number of light emitting diodes used. In the small-sized backlight used in the light crystal display of a mobile telephone, in particular, it has become possible to supply the amount of light required by the backlight by means of a single light emitting diode.

In the surface light emitting apparatus disclosed in patent documents 1 through 3, for example, light is introduced through a corner of the optical guide, instead of the side face of the optical guide as in the prior art, in consideration of the light distribution characteristic of the light emitting diode and the ease of light emitted by the light emitting diode to spread in the optical guide.

When the number of light emitting diodes is reduced, it becomes more important to spread the light coming from the light source uniformly over a surface. For example, in the surface light emitting apparatus disclosed in Patent Documents 1 to 3 that use the optical guide where light is introduced through a corner, an effective light emitting region used in observing the light emission has generally rectangular shape. This configuration makes it necessary to provide surface light emission so that uniform luminance is obtained at the four corners of the rectangle.

The corner of the optical guide through which light from the light emitting diode is introduced is nearest to the light emitting surface of the light emitting diode, and directly receives the light from the light emitting diode. Accordingly, it is necessary to cause the three corners other than this corner to illuminate evenly. FIG. 6 is an enlarged top view of a corner of an optical guide of a surface light emitting apparatus where light is introduced through an end face located in a corner of the optical guide. FIG. 13 is a perspective view of the corner of the optical guide.

Incident light cannot be spread evenly in every direction simply by forming a light introducing surface by chamfering the corner flat as shown in FIG. 6 and FIG. 13. Sufficient light does not reach, in particular, a region located at a position offset from the straight propagation path of light that has entered the light introducing surface at right angles.

An optical guide disclosed in Japanese Unexamined Patent Publication (Kokai) No. 2001-357714, for example, has notches formed in the light introducing surface so as to spread light coming from the light emitting diode evenly in every direction within the optical guide. FIG. 5 is a top view of the notches formed in the corner of the optical guide. FIG. 12 is a top view of the notches shown in FIG. 5, viewed in the direction of the light emerging surface. The notches have the shape of triangular prism formed from side faces that include equal sides of the cross section having the shape of isosceles triangle, when viewed from the light emerging surface of the optical guide.

When the light emerging surface is formed in square shape, light can be spread to some extent by forming the notches in the corner.

Patent Document 1: Japanese Unexamined Patent Publication (Kokai) No. 10-223021
Patent Document 2: Japanese Unexamined Patent Publication (Kokai) No. 2000-260217
Patent Document 3: Japanese Unexamined Patent Publication (Kokai) No. 2001-357714

DISCLOSURE OF THE INVENTION

However, the light emerging surfaces of optical guides that are commonly used have rectangular shape. As a result, there arises a difference in luminance of light emission between a region located relatively far from and a region located near to a corner through which light is introduced. For example, even when the notches of the prior art described above are provided, there is a difference in luminance of light emission due to the difference in the length of optical path from the corner, between a region located along a shorter side of rectangle and a region located along a longer side of the rectangle. Thus the optical guides of the prior art fail to emit light of uniform intensity and high luminance.

Accordingly, an object of the present invention is to provide a light emitting apparatus that is capable of emitting light with uniform intensity and high luminance.

In order to achieve the object described above, a first optical guide of the present invention comprises a first principal surface that has an effective light emitting region of substantially rectangular shape surrounded by first through fourth sides and a second principal surface that opposes the first principal surface, wherein the circumferential side face of the optical guide includes first through fourth side faces disposed along the first through fourth sides, respectively, and a light introducing section, disposed at the corner interposed between the first and second side faces, with an angle of inclination from the first side face that is determined so that center axis of light distribution intersects one of the first through fourth sides and divides the area of the effective light emitting region into two equal parts.

In the first optical guide of the present invention, the light introducing section has notch comprising a first light diffusion surface and a second light diffusion surface, where angle $\theta_1$ between a reference plane perpendicular to the center axis of light distribution and the first light diffusion surface and angle $\theta_2$ between the reference plane and the second light diffusion surface may be different.

This configuration enables it to provide a light emitting apparatus that emits light with uniform and high intensity over the entire effective light emitting region even when the effective light emitting region has a rectangular shape.

The notches may be shaped either in triangular prism or triangular pyramid.

In the first optical guide of the present invention, it is preferable that angle $\theta_1$ is larger than angle $\theta_2$ in case the effective light emitting region has a shape of rectangle of which longer side is the first side described above.

In the first optical guide of the present invention, it is preferable that angle $\theta_1$ is smaller than angle $\theta_2$ in case the effective light emitting region has a shape of rectangle of which shorter side is the first side described above.

In the first optical guide of the present invention, one of the first through fourth side faces may be an arced surface or a surface that includes an arced surface as part thereof.

In order to achieve the object described above, a second optical guide of the present invention has a rectangular light emerging surface and a light introducing surface constituted from the side face located at the corner of the rectangle, wherein the light introducing surface includes notches each having at least a reference light introducing surface 13 that introduces light in diagonal direction of the rectangle, a first light diffusion surface 15 that guides the light in the direction of longer side of the rectangle and a second light diffusion surface 17 that guides the light in the direction of shorter side of the rectangle, the angle $\theta_1$ between a plane of extension 23 from the reference light introducing surface and the second light diffusion surface 17 is different from the angle $\theta_2$ between the plane of extension 23 and the first light diffusion surface 15.

Relation of the angle $\theta_1$ and angle $\theta_2$ may be either $\theta_1 > \theta_2$ or $\theta_1 < \theta_2$.

The notches are preferably shaped either in triangular prism or triangular pyramid.

Width of the reference light introducing surface 13 is preferably in a range from 1 to 2 times the width of the notch.

The shortest distance between the plane of extension 23 from the reference light introducing surface and the intersection between the first light diffusion surface 15 and the second light diffusion surface 17 is preferably 200 μm or less.

In a third optical guide of the present invention that has a light emerging surface of trapezoidal shape and a light introducing surface constituted from a side face of a corner of the trapezoidal shape, the light introducing surface includes notches each having at least a reference light introducing surface 13 that introduces light in diagonal direction of the rectangle, the first light diffusion surface 15 that guides the light in the direction of the longer side and the second light diffusion surface 17 that guides the light in the direction of the shorter side, while the angle $\theta_2$ between the plane of extension 23 from the reference light introducing surface and the second light diffusion surface 17 is different from the angle $\theta_1$ between the plane of extension 23 and the first light diffusion surface 15.

Relation of the angle $\theta_1$ and the angle $\theta_2$ may be either $\theta_1 > \theta_2$ or $\theta_1 < \theta_2$.

At least one of two sides that extend from the corner of the trapezoidal shape preferably has an arc shape.

The notches are preferably shaped either in triangular prism or triangular pyramid.

Width of the reference light introducing surface 13 is preferably in a range from 1 to 2 times the width of the notch.

The shortest distance between the plane of extension 23 from the reference light introducing surface and an intersection between the first light diffusion surface 15 and the second light diffusion surface 17 is preferably 200 μm or less.

When the trapezoid described above is isosceles trapezoid, it is preferable that a plurality of corners have notches.

The present invention also provides a surface light emitting apparatus comprising a point light source and the optical guide described above that is optically connected to the point light source.

The point light source is preferably a light emitting diode.

The light emitting diode preferably has an LED chip and a fluorescent material that converts light from the LED chip to light of a different wavelength.

The light emitting diode preferably emits light produced by blending light from the LED chip and light from the fluorescent material. The blended light is preferably white light.

The optical guide of the present invention makes it possible to improve the uniformity of light intensity across the light emitting surface, compared to the conventional optical guide.

DESCRIPTION OF REFERENCE NUMERALS

Figure 1:
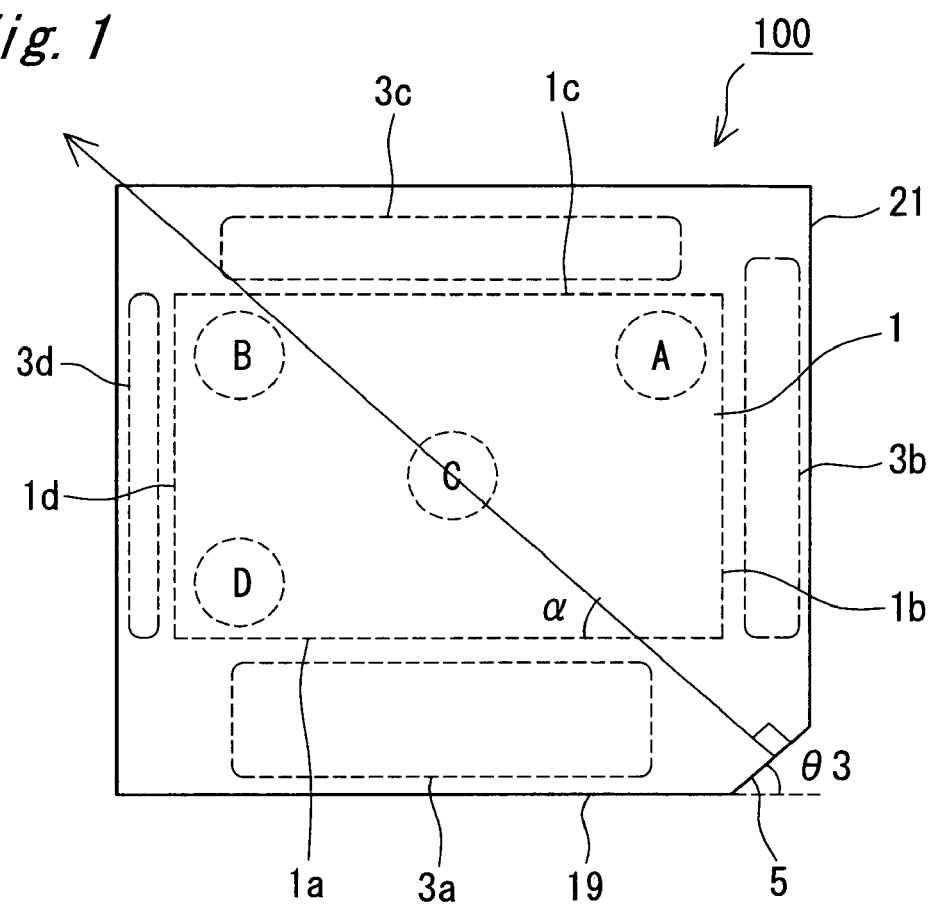
FIG. 1 is a top view of an optical guide according to a first embodiment of the present invention.

1: Effective light emitting region
3: Non-observing region
5: Corner
11: Arc
13: Reference light introducing surface
15: First light diffusion surface
17: Second light diffusion surface
19: First side face
21: Second side face
23: Plane of extension from reference light introducing surface
25: Distance between the plane of extension from reference light introducing surface and intersection of first light diffusion surface and second light diffusion surface
100: Optical guide

BEST MODE FOR CARRYING OUT THE INVENTION

Best mode for carrying out the present invention will now be described below with reference to the accompanying drawings. It is understood, however, that the forms described below it intended to merely exemplify the optical guide and surface light emitting apparatus that materialize the concept of the present invention, and are not intended to limit the optical guide and surface light emitting apparatus of the present invention. The drawings may include exaggeration with regards to the size and positional relationship of members, for the purpose of the ease of understanding.

First Embodiment

Figure 2:
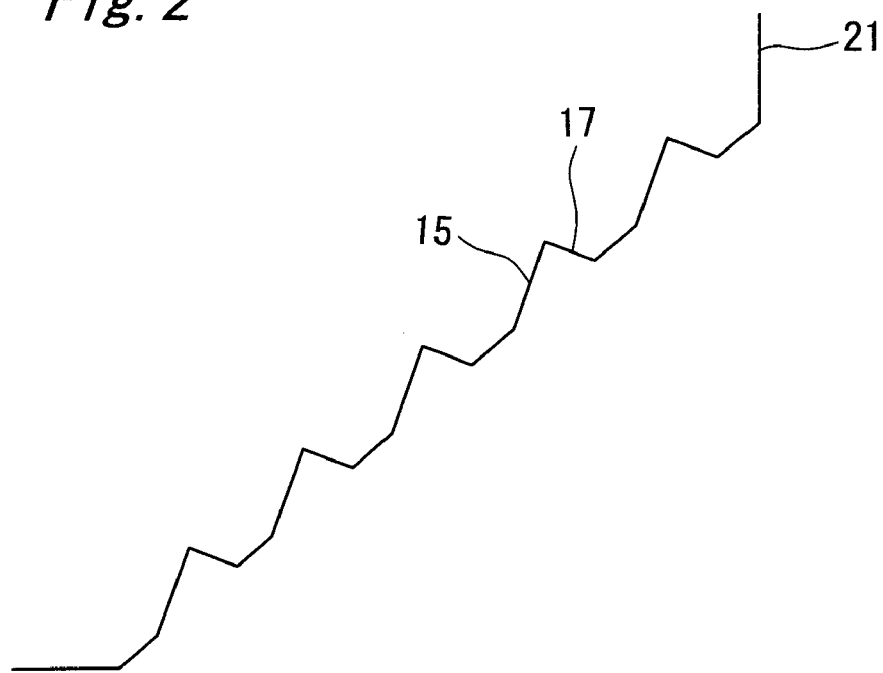
FIG. 2 is an enlarged top view showing a corner of the optical guide according to the first embodiment.
Figure 3:
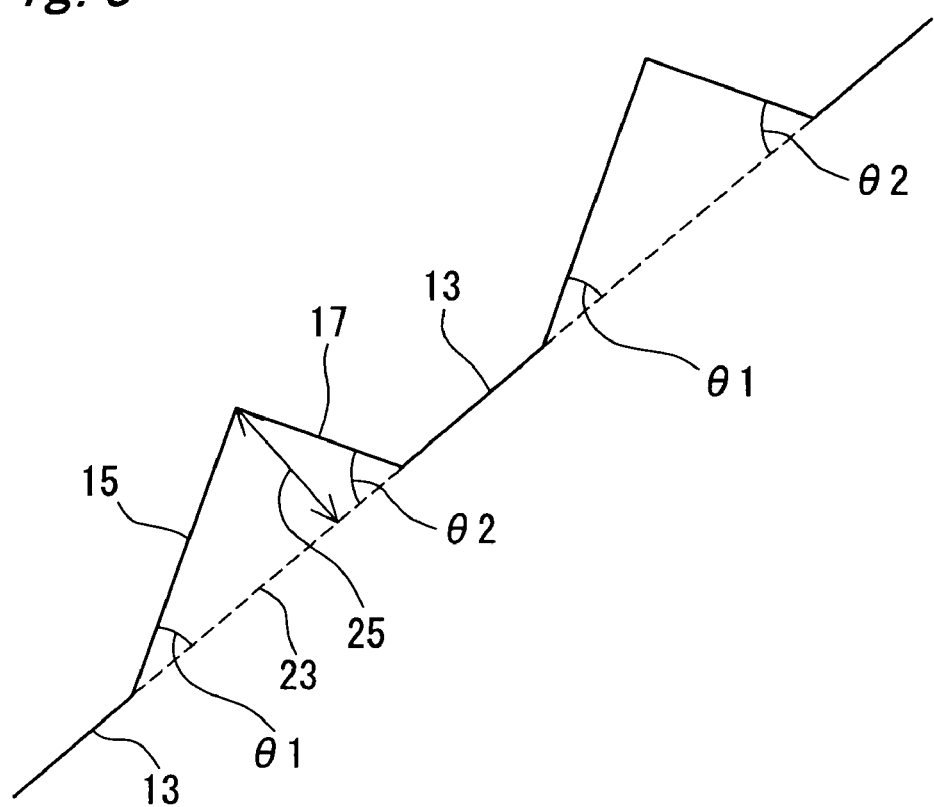
FIG. 3 is an enlarged top view of notch shown in FIG. 2.
Figure 4:
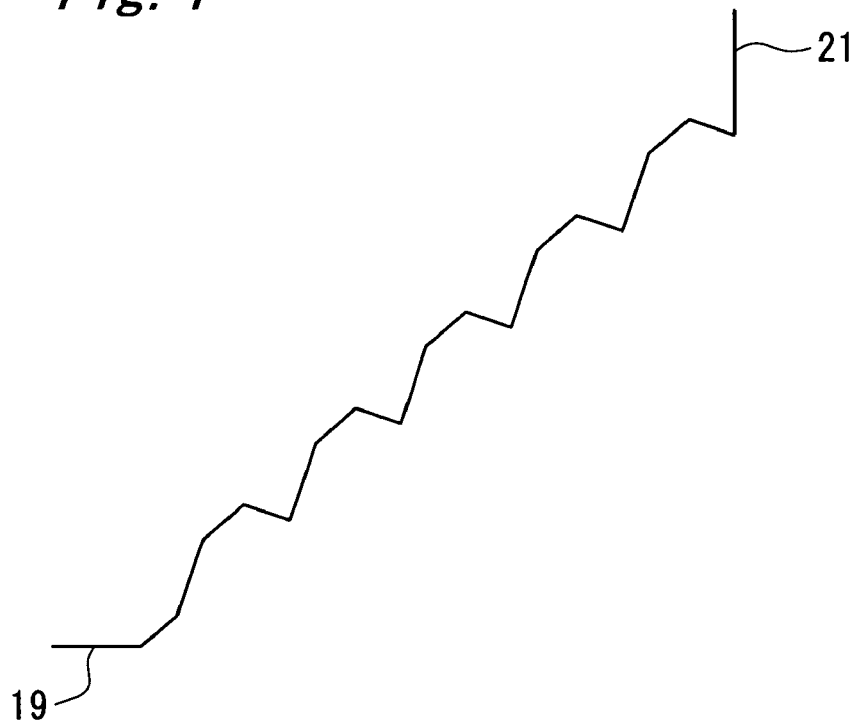
FIG. 4 is an enlarged top view showing another form of notch of the optical guide according to the first embodiment.
Figure 5:
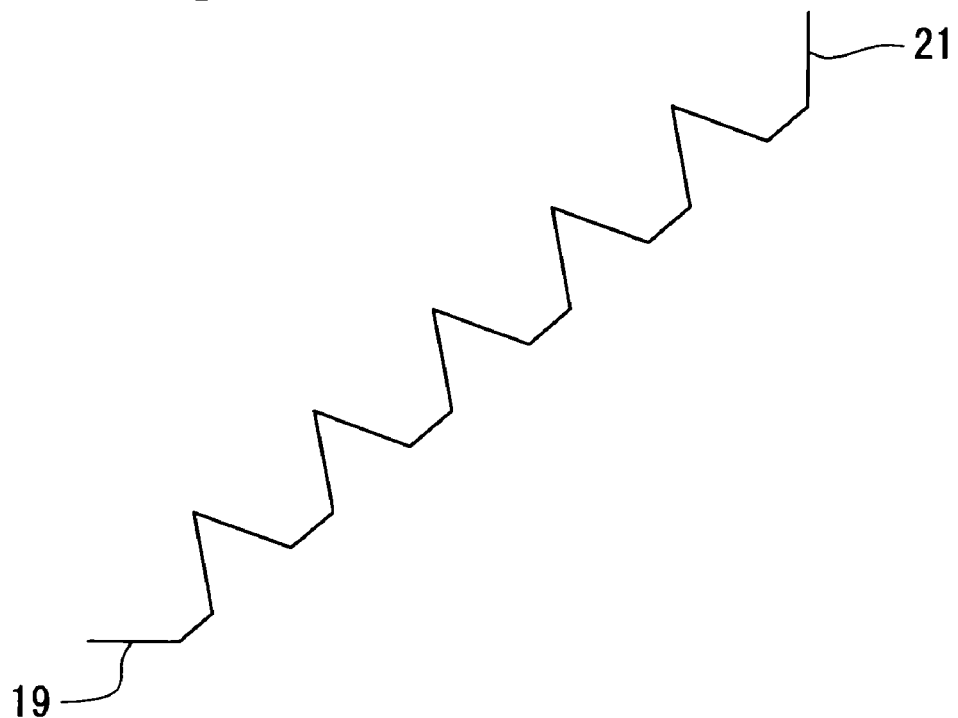
FIG. 5 is an enlarged top view showing a corner that include notches in the optical guide of the prior art.
Figure 6:
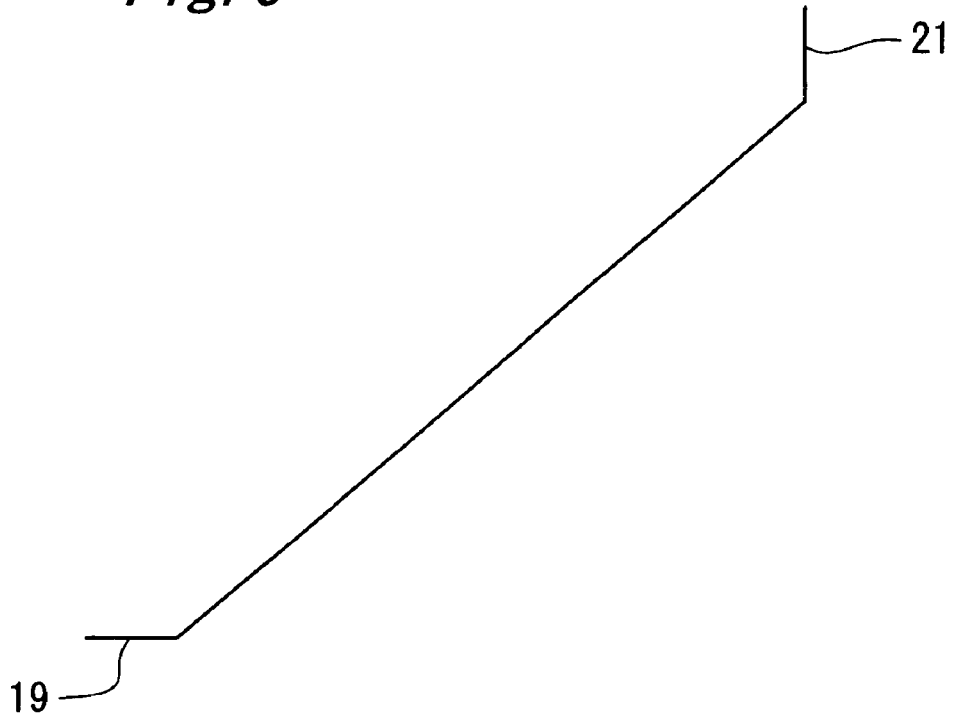
FIG. 6 is an enlarged top view showing a corner in the optical guide of the prior art.
Figure 7:
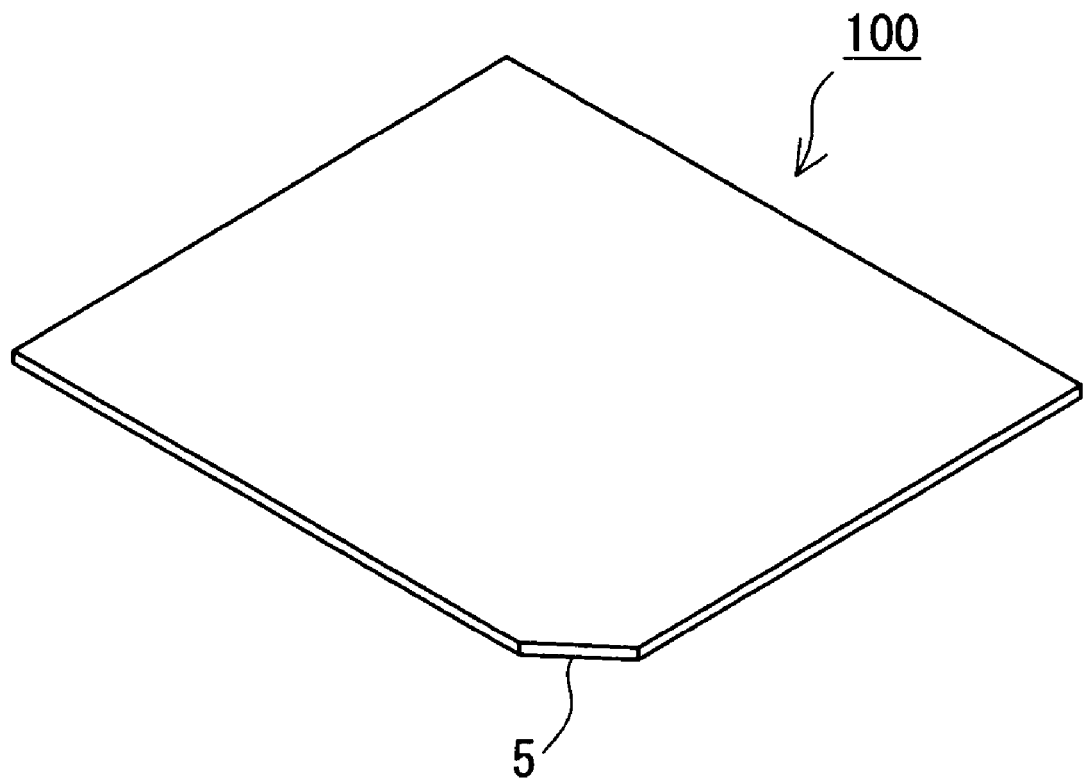
FIG. 7 is a perspective view of the optical guide according to the first embodiment.

FIG. 1 is a top view of an optical guide 100 of the first embodiment viewed in the direction of light emerging surface. FIGS. 2 through 4 are enlarged top views showing a corner 5 of the optical guide 100 of this embodiment. FIG. 3, in particular, is an enlarged top view of notch located in the corner shown in FIG. 2. FIG. 7 is a perspective view of the optical guide 100 of this embodiment. FIGS. 8 through 11 are enlarged perspective views of notches having various forms provided at the corner of the optical guide 100 of this embodiment. FIG. 3 is an enlarged view of the notch shown in FIG. 8 viewed in the direction perpendicular to the light emerging surface.

The optical guide 100 of the first embodiment that includes an effective light emitting region 1 of rectangular shape that has a long side and a short side in the light emerging surface, the light emerging surface being constituted by forming the notches in an inclined surface obtained by obliquely cutting off at least one corner. The inclined surface is a surface that is used as the reference for defining the direction of incident light and the shape of the notch, and will therefore be referred to also as the reference plane in this application.

The notch in the light introducing section has at least a first light diffusion surface 15 that guides light in the direction of the longer side of the rectangle and a second light diffusion surface 17 that guides the light in the direction of the shorter side of the rectangle (FIG. 2 and FIG. 3), and the notch may include a surface other than the first light diffusion surface 15 and the second light diffusion surface 17.

In the optical guide of the first embodiment shown in FIG. 3, the reference light introducing surface 13 that guides the light in the direction of the center axis of light distribution is provided between adjacent notches (or on both side of a notch).

The optical guide 100 of the first embodiment is characterized in that the angle $\theta_1$ between the reference plane and the first light diffusion surface 15 (angle $\theta_1$ between the plane of extension 23 of the reference light introducing surface 13 and the first light diffusion surface 15) is different from the angle $\theta_2$ between the reference plane and the second light diffusion surface 17 (angle $\theta_2$ between the plane of extension 23 and the second light diffusion surface 17). This configuration enables it to maintain the uniformity of luminance over the effective light emitting region 1. The angle $\theta_1$ and the angle $\theta_2$ are different in any cross section parallel to the light emerging surface of the optical guide.

The plane that includes the reference light introducing surface 13 and the plane of extension 23 is the reference plane.

The optical guide 100 of the first embodiment has the effective light emitting region 1 that comprises a central portion of the light emerging surface except for the peripheral portion thereof as shown in FIG. 1, rather than one of the principal surfaces (first principal surface) that constitutes the light emerging surface as a whole making the effective light emitting region. As a result, it is necessary to maintain uniform light emission across the effective light emitting region 1, rather than over one of the principal surfaces as a whole. The light introducing section of the optical guide 100 is determined in accordance to the layout of the components of the apparatus wherein the optical guide is used, and is provided, for example, at the corner of the optical guide.

Accordingly, in the first embodiment, in the optical guide that has the rectangular effective light emitting region 1 having a longer side and a shorter side included in the light emerging surface and introduces light through a corner thereof, the angle $\theta_1$ between the reference plane and the first light diffusion surface 15 is set different from the angle $\theta_2$ between the reference plane and the second light diffusion surface 17 so as to maintain uniform light emission over the effective light emitting region 1.

Specifically, in the effective light emitting region 1 of the first embodiment, the angle $\theta_1$ between the reference plane and the first light diffusion surface 15 is set larger than the angle $\theta_2$ (in other words, area of the first light diffusion surface 15 is made larger than the area of the second light diffusion surface 17) so as to make the luminance in a region D located far along the longer side approximately equal to the luminance in a region A located far along the shorter side, thereby to guide sufficient light to the region D that is located far from the region A.

According to the present invention, as described above, the angle $\theta_1$ of the first light diffusion surface 15 is set to a value different from the angle $\theta_2$ of the second light diffusion surface 17 so as to guide enough light to the region D located more distant than the region A, thereby making the luminance uniform over the effective light emitting region 1. In the present invention, it is preferable to optimize the inclination angle $\theta_3$ of the reference plane, angle $\theta_1$ and angle $\theta_2$ so that the luminance can be made more uniform across the effective light emitting region 1.

A method for optimizing the inclination angle $\theta_3$ of the reference plane, angle $\theta_1$ and angle $\theta_2$ will be described below.

According to this method, first, the inclination angle $\theta_3$ of the reference plane is set to a preferable value (or within a preferable range) in accordance with the position and range of the effective light emitting region in the light emerging surface and the position of the light introducing section.

The light introducing section is provided at the corner that is interposed between the two side faces (the first side face 19 and the second side face 21). The inclination angle $\theta_3$ is the angle of inclination from the first side face 19 as shown in FIG. 1. The first side face 19 is the side face of the optical guide running along the longer side of the effective light emitting region 1, and the second side face 21 is the side face of the optical guide running along the shorter side of the effective light emitting region 1.

Position of the effective light emitting region 1 is defined, for example, by the distance from the circumferential side face of the optical guide. In the first embodiment, non-observing regions 3a, 3b, 3c, 3d are provided between the effective light emitting region 1 and the circumferential side face of the optical guide, as shown in FIG. 1.

In a practical sequence, first, the inclination angle $\theta_3$ is set so that the area of the effective light emitting region 1 is divided into two equal parts by the center axis of light distribution of the light introducing section. That is, the area of the effective light emitting region 1 is divided into two equal parts by the center axis of light distribution. In case the center axis of light distribution intersects the first side 1a that is the longer side of the effective light emitting region 1, for example, it is disposed so as to intersect the third side 1c that opposes the first side 1a (shown in FIG. 1). In case the center axis of light distribution intersects the second side 1b that is the shorter side of the effective light emitting region 1, it is disposed so as to intersect the fourth side 1d that opposes the second side 1b. When the inclination angle $\theta_3$ is configured in this way, light coming from the light source through the light introducing section is introduced so as to be divided into two substantially equal parts on both sides of the center axis of light distribution in the effective light emitting region 1.

The center axis of light distribution is perpendicular to the light introducing end face of the light introducing section that is determined by the inclination angle $\theta_3$, and corresponds to the axis of symmetry of the intensity distribution (directivity) of light emitted by the light source when the light source is located. Intensity of light emitted by the light source is the value measured in various directions in a plane that includes the effective light emitting region of the optical guide (or in a plane parallel to the effective light emitting region).

Figure 37:
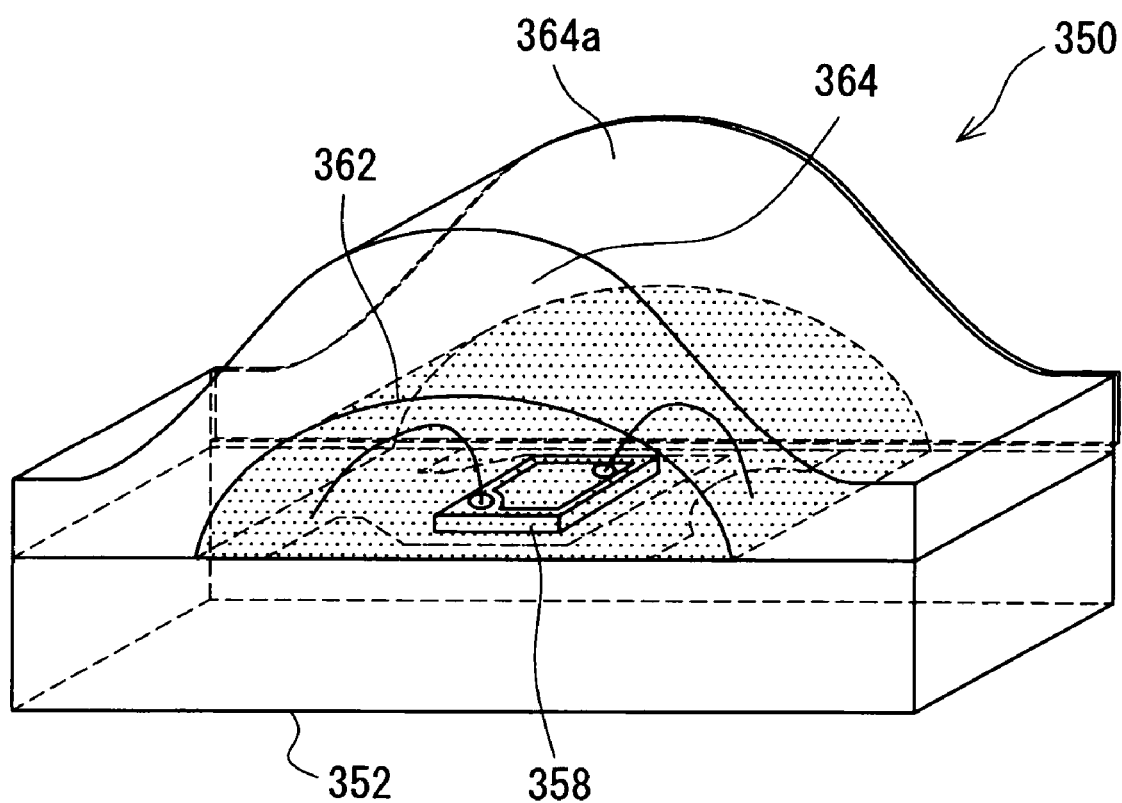
FIG. 37 is a perspective view showing an example of light emitting diode combined with the optical guide of the third embodiment.

With the optical guide of this embodiment, light sources that have different directivity patterns may be used due to the surface where the intensity of light emission is measured (for example, the principal surface and a surface perpendicular thereto). For example, a light source that has a semi-cylindrical lens as shown in FIG. 37 has different directivity for the emitted light measured within a plane including the center axis of the semi-cylinder and for the emitted light measured within a plane that is perpendicular to the center axis. That is, the directivity pattern of the emitted light measured within a plane that includes the center axis of the semi-cylinder has symmetrical configuration having a single peak of intensity in the direction of the center axis perpendicular to the mounting substrate (indicated by D1 in FIG. 38). The directivity pattern of the emitted light measured within a plane perpendicular to the center axis has two peaks of intensity located symmetrically with respect to the direction of the center axis that is perpendicular to the mounting substrate (indicated by D2 in FIG. 38). Even when the light source having such directivity is used, uniform optical output can be obtained by means of the optical guide of this embodiment, by making the axis of symmetry of the directivity pattern of the emitted light measured within a plane including the center axis agree with the center axis of light distribution. The outline configuration is not limited to semi circle, and other shapes enclosed by other quadratic curves such as ellipse may be employed.

Then the angle $\theta_1$ between the reference plane of the notch prism and the first light diffusion surface 15 and the angle $\theta_2$ between the reference plane and the second light diffusion surface 17 are determined so that the luminance of light emission becomes uniform within the effective light emitting region 1.

Specifically, in case the center axis of light distribution intersects the first side, namely the longer side, the angles are optimized so that the region A and the region D emit light with the same luminance in FIG. 1, under the conditions that $\theta_1$ is smaller than $\theta_2$.

This configuration enables it to make the area of the first light diffusion surface that directs the incident light in the direction of the longer side larger than the area of the second light diffusion surface that directs the light in the direction of the shorter side. As a result, a larger part of light can be directed in the direction of longer side, and therefore light intensity in the region A that is nearer to the light source and light intensity in the region D that is far from the light source can be made substantially equal to each other. Thus uniform luminance over the effective light emitting region can be achieved.

In case the first side is the shorter side, the angles are optimized under the conditions that $\theta_1$ is larger than $\theta_2$.

According to the method of the present invention described above, it is made possible to obtain an optimum directivity within the optical guide and achieve uniform surface light emission by adjusting the inclination angle $\theta_3$ of the optical guide and the angle $\theta_1$ and angle $\theta_2$ of the notch while giving consideration to the directivity of the light source.

Structures of the light introducing section and the notch and variations thereof will now be described in detail.

Notch prisms of the first embodiment shown in FIGS. 1 through 3 are prisms defined by the plane of extension 23 from the reference plane, the first light diffusion surface 15 and the second light diffusion surface 17. According to the present invention, the optical guide may have the reference light introducing surface 13 that guides light in the direction of the center axis of light distribution between the notch prisms formed in these surfaces as shown in FIG. 2 and FIG. 3, or the bottom surface of the notch may be formed in a flat surface parallel to the reference plane with the flat surface being used as the light introducing surface that guides light in the direction of the center axis of light distribution.

Figure 8:
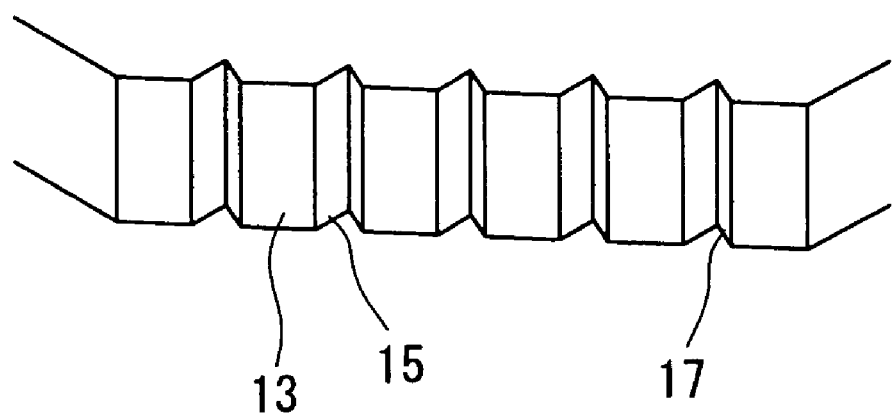
FIG. 8 is an enlarged perspective view showing the corner where a light introducing section having notches of triangular prism shape is formed in the optical guide according to the first embodiment.
Figure 9:
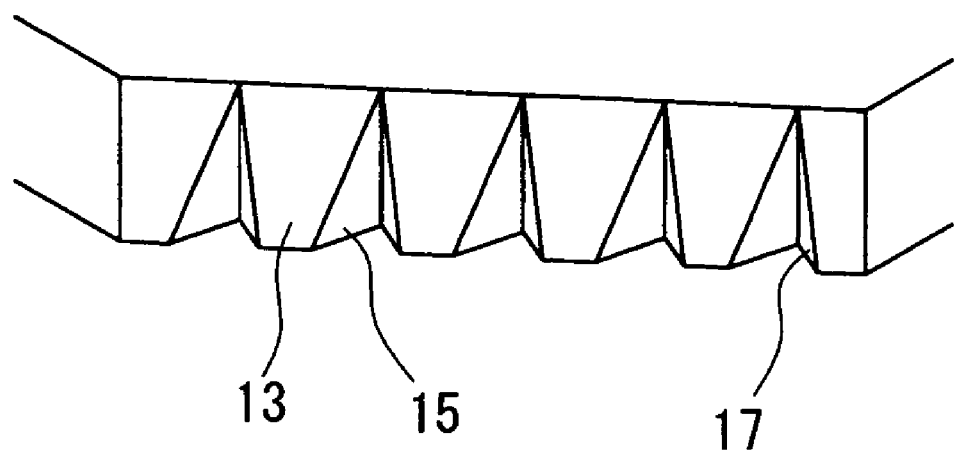
FIG. 9 is an enlarged perspective view showing the corner where a light introducing section having notches of triangular pyramid shape is formed in the optical guide according to the first embodiment.
Figure 11:
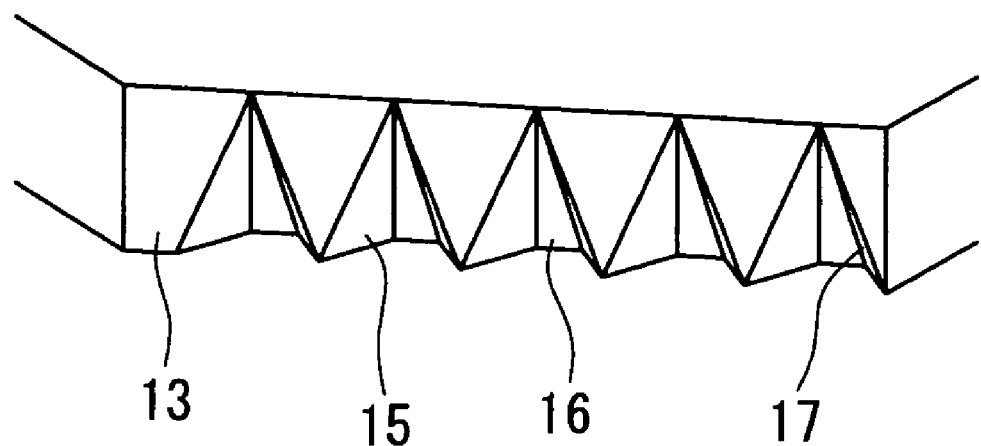
FIG. 11 is a perspective view showing an example where a notch that includes flat surface 16 instead of reference light introducing surface 13 is formed in the light introducing section shown in FIG. 9.
Figure 12:
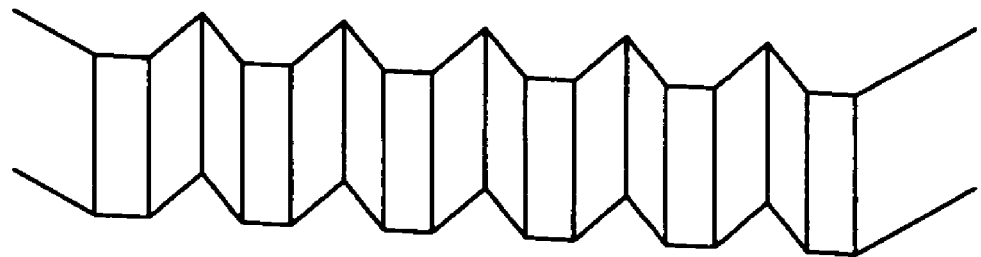
FIG. 12 is an enlarged perspective view showing the corner in an optical guide of the prior art.
Figure 13:
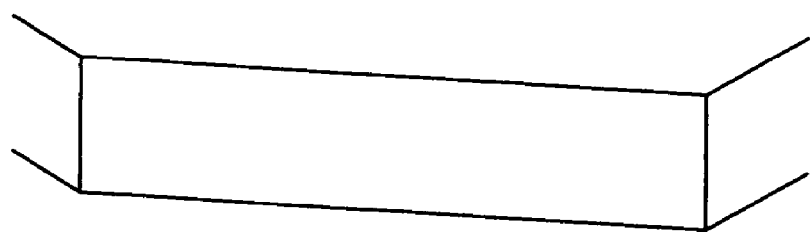
FIG. 13 is an enlarged perspective view showing the corner in the optical guide of the prior art.

Also according to the present invention, the notch prism may have a shape of triangular pyramid shown in FIG. 9 or triangular prism shown in FIG. 8, while the shape of triangular pyramid shown in FIG. 9 is preferable. When the notch is formed in the shape of triangular pyramid with the apex pointed toward the light emerging surface, a part of the light source can be enclosed and therefore efficiency of introducing light from the light source can be improved. Also according to the present invention, a flat surface 16 may be provided between the first light diffusion surface 15 and the second light diffusion surface 17 within the notch of triangular pyramid shape as shown in FIG. 11. This enables it to diffuse the light over a wider range.

Figure 10:
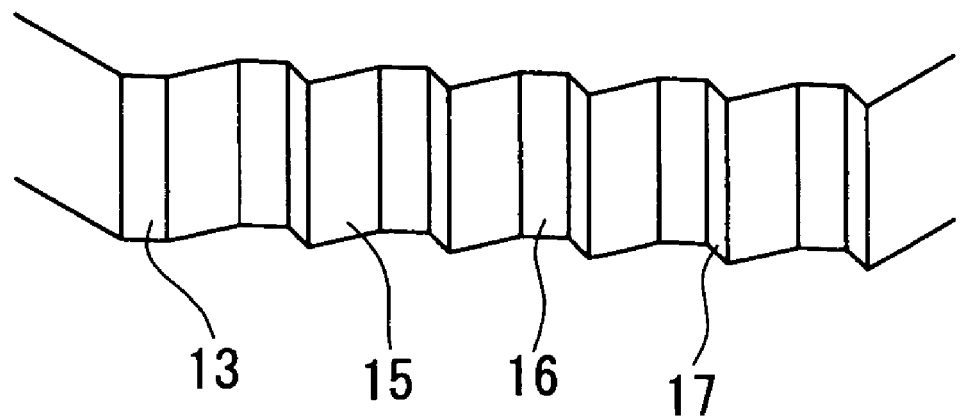
FIG. 10 is a perspective view showing an example where a notch that includes a flat surface 16 instead of the reference light introducing surface 13 is formed in the light introducing section shown in FIG. 8.

FIG. 8 shows a notch prism having triangular prism shape, where the light introducing section having the reference light introducing surface 13 (a part of inclined surface) disposed on the reference plane is provided between adjacent notches. FIG. 10 shows the structure of the notch prism that has a flat surface 16 that guides light in the direction of the center axis of light distribution provided between the first light diffusion surface 15 and the second light diffusion surface 17 within the notch, instead of the reference light introducing surface 13. FIG. 4 is a top view of the notch prism shown in FIG. 10, viewed from the direction of the light emerging surface.

Width of the reference light introducing surface 13 is preferably in a range from 1 to 2 times the width of the notch. This enables it to distribute the incident light in every direction of the optical guide. In case the notch has triangular prism shape, width of the notch is the length of the base located on the reference plane and width of the reference light introducing surface 13 is the distance between the apexes of adjacent notches. In case the notch has triangular prism shape, width of the notch and width of the reference light introducing surface 13 are the width located on the reference plane.

In this embodiment, depth 25 of the notch (shown in FIG. 3) is preferably 200 μm or less. When the depth is too large, efficiency of introducing light into the optical guide becomes low. The depth 25 of the notch is the distance between the intersection of the first light diffusion surface 15 and the second light diffusion surface 17 and the reference plane, or the distance between the intersection and the reference plane on the base surface in case the notch has triangular pyramid shape.

As a point light source is disposed in the light introducing section of the optical guide in the first embodiment having the constitution described above, the surface light emitting apparatus of the present invention is constituted. In the surface light emitting apparatus constituted by optically connecting the optical guide of the present invention and the light source, it is preferable to use a light emitting diode as the point light source. Use of the light emitting diode makes it possible, for example, to make the power consumption smaller than that of one that utilizes a cold electron tube of the prior art, and provide the compact surface light emitting apparatus that is capable of surface light emission with uniform intensity of emission.

One of preferable forms of the light introducing section of the optical guide according to the first embodiment is shown in FIG. 3. The light introducing section shown in FIG. 3 comprises the reference light introducing surface 13 that introduces light in the direction of the center axis of light distribution, the first light diffusion surface 15 that guides the light in the direction of the longer side of the rectangular effective light emitting region and the second light diffusion surface 17 that guides the light in the direction of the shorter side of the rectangular effective light emitting region.

In the optical guide of the first embodiment, as described above, the angle $\theta_2$ between the plane of extension 23 and the second light diffusion surface 17 is set to be larger than the angle $\theta_1$ between the plane of extension 23 and the first light diffusion surface 15. This enables it to direct a larger part of light in the direction of the longer side than in the direction of shorter side of the effective light emitting region, and therefore surface light emission with uniform intensity of emission can be achieved. This relation between the angle $\theta_1$ and the angle $\theta_2$ can be advantageously applied to a case where the light emerging surface of the optical guide has rectangular or trapezoidal shape which is delimited by straight sides. That is, the circumferential side face of the optical guide (periphery of the light emerging surface) has the first through fourth side faces disposed along the first through fourth sides of the effective light emitting region, respectively, and a light introducing section, while the first through fourth side faces are usually straight. However, the present invention is not limited to the constitution where the side faces of the optical guide are straight, and the side faces may be arced.

Figure 14:
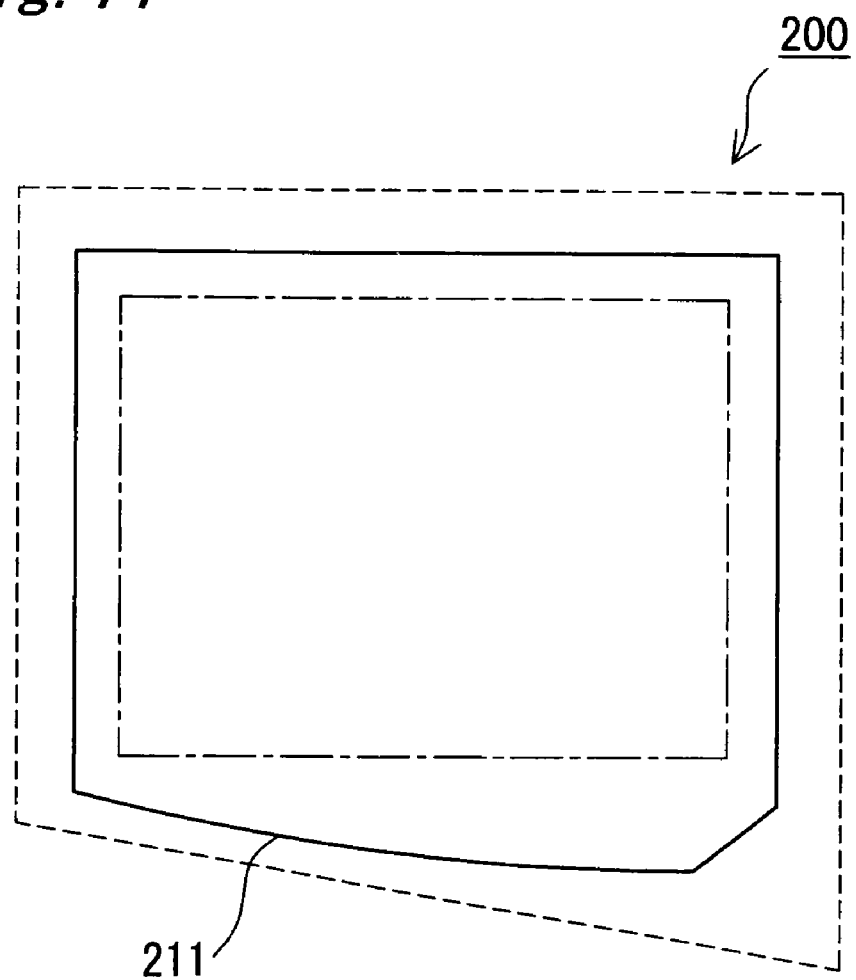
FIG. 14 is a top view showing a first example of circumferential configuration of an optical guide according to a second embodiment of the present invention.

As shown in FIG. 14 and other drawing, when a part of the circumferential side face of the light emerging surface is an arc protruding toward the outside, the arced surface 211 enables it to achieve effective total reflection of light incident on the arced surface 211, so that a region that is located outside of the effective light emitting region and is not used in the observation of light emission where light is not emitted with uniform intensity (this region will hereinafter be referred to as non-observing region 3) can be reduced. In other words, the proportion of the effective light emitting region 1 in the light emerging surface of the optical guide can be increased.

Values of the angle $\theta_1$ and the angle $\theta_2$ vary depending on the aspect ratio of the effective light emitting region 1 of the optical guide, the angle $\theta_3$ between the reference light introducing surface 13 and the plane of extension from the first side face 19 and the acute angle $\theta_4$ (shown in FIG. 15) having the notch in case the light emerging surface side has trapezoidal shape. It also varies depending on the refractive index of the optical guide, and other factors.

There are increasing demands to reduce the size and space requirement for the backlight used in mobile telephone, where optical guides measuring mainly in a range from 1.8 to 2.0 inches are used. Theoretical values of $\theta_1$, $\theta_2$ and $\theta_3$ of such an optical guide are in a range from 0 to 90°. Optimum values of these angles are determined by the ratio of the longer side to the shorter side of the rectangle of the light emerging surface and the refractive index of the material that constitutes the optical guide, and is preferably in ranges from 20 to 60° for $\theta_1$, from 30 to 80° for $\theta_2$ and from 30 to 70° for $\theta_3$.

As shown in FIG. 1, the effective light emitting region 1 (indicated by dashed line in FIG. 1) that has the region C at the center thereof has rectangular shape. As a result, the light emerging surface of the optical guide that includes the effective light emitting region 1 has a shape of substantially a rectangle larger than the outline of the effective light emitting region 1. The corner (the light introducing section) through which light from the light emitting diode is introduced is chamfered so that the light emitting surface of the light emitting diode can easily face therewith. Accordingly, outline the light emerging surface of the optical guide is not shaped exactly in rectangle.

FIGS. 25 through 31 are top views (viewed from the side of the light emerging surface) showing variations of the optical guide of the first embodiment where circumferential configuration of the optical guide is formed in various shapes and outline of the light emerging surface has substantially rectangular shape. The light emerging surfaces of these variations are constituted similarly to that of the first embodiment.

Figure 25:
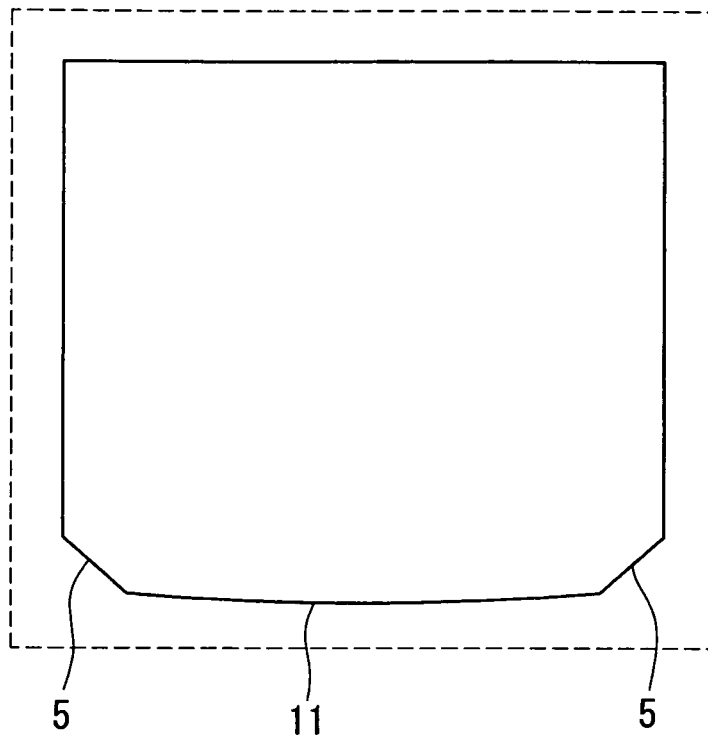
FIG. 25 is a top view showing an optical guide according to a first variation of the first embodiment.
Figure 26:
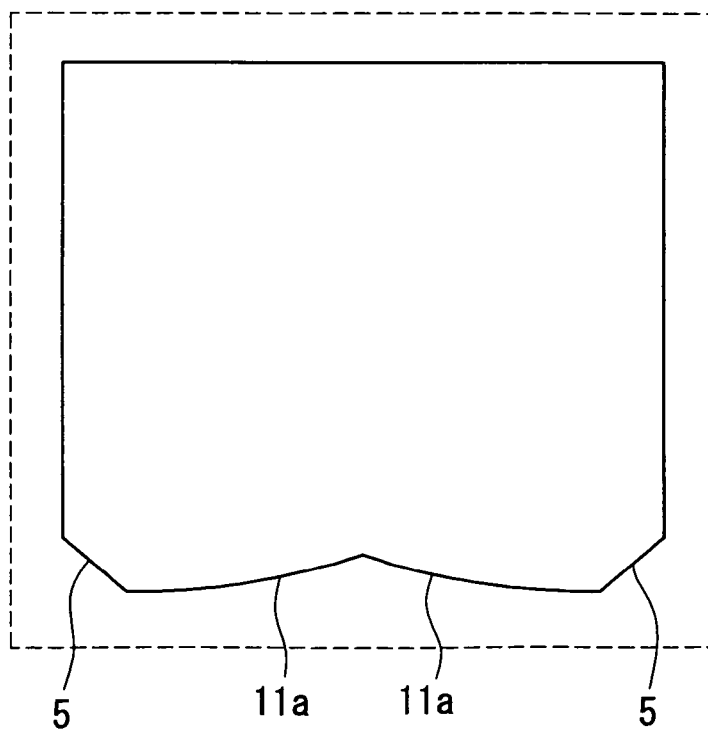
FIG. 26 is a top view showing an optical guide according to a second variation of the first embodiment.
Figure 27:
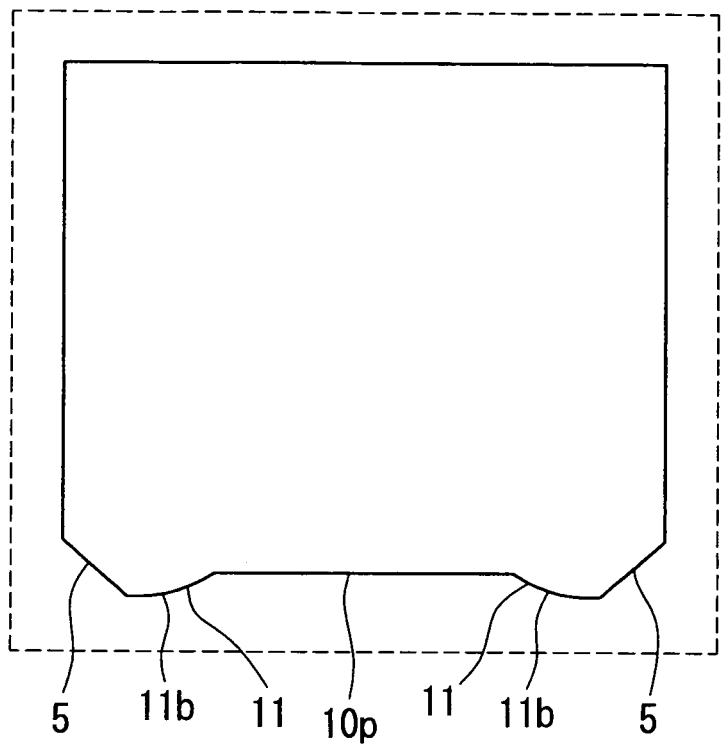
FIG. 27 is a top view showing an optical guide according to a third variation of the first embodiment.

Among FIGS. 25 through 31, FIGS. 25 through 29 are top views showing examples of the optical guide where light is introduced through two chamfered corners. The light introducing sections provided at the two corners include notches where angle $\theta_1$ and angle $\theta_2$ are set so that the light rays introduced through the light introducing sections illuminate uniformly over the effective light emitting region. Introducing light through a plurality of corners enables it to achieve emission of light with uniform and high luminance. FIG. 25, in particular, shows an example of the optical guide where two corners 5 on the side of the longer side of the rectangle are chamfered, while the notch is provided in the chamfered surface. Moreover, the side face between the corners 5 is formed in arced surface 11. In the configuration shown in FIG. 25, reflectivity is improved by using the arced surface 11 so that the area of the effective light emitting region 1 can be increased. FIG. 26 shows an example where the light introducing sections are provided at the two corners 5 similarly to the optical guide shown in FIG. 25, and an arced surface 11a of the same size is provided between the light introducing sections. FIG. 27 shows an optical guide where the arced surface 11b is made smaller than that of the optical guide shown in FIG. 26 and a flat surface 10p is provided between the arced surface 11b. Since a larger part of light is reflected on the arced surface into the direction of the shorter side by providing the arced surface 11b shown in FIG. 27, the effective light emitting region 1 can be formed in a rectangle that has larger lateral dimension than in the case shown in FIG. 26.

Figure 28:
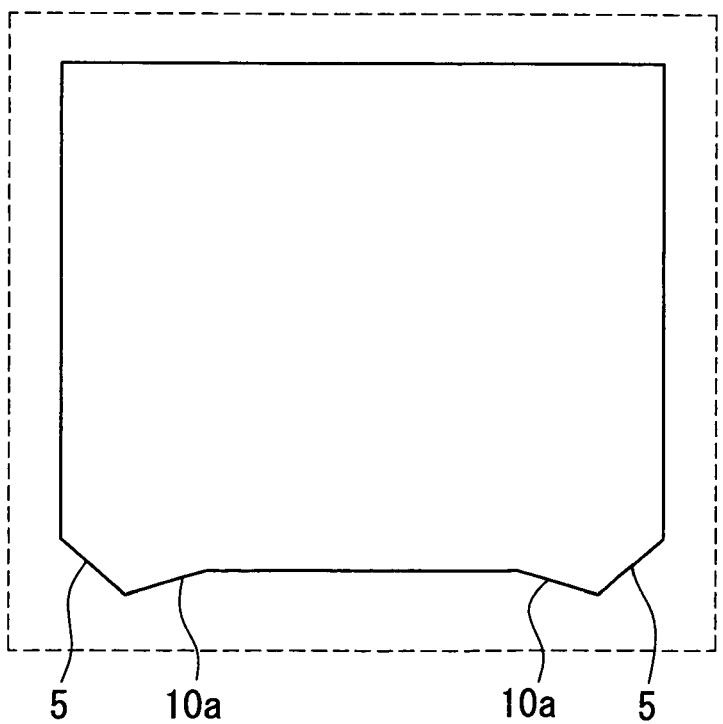
FIG. 28 is a top view showing an optical guide according to a fourth variation of the first embodiment.
Figure 29:
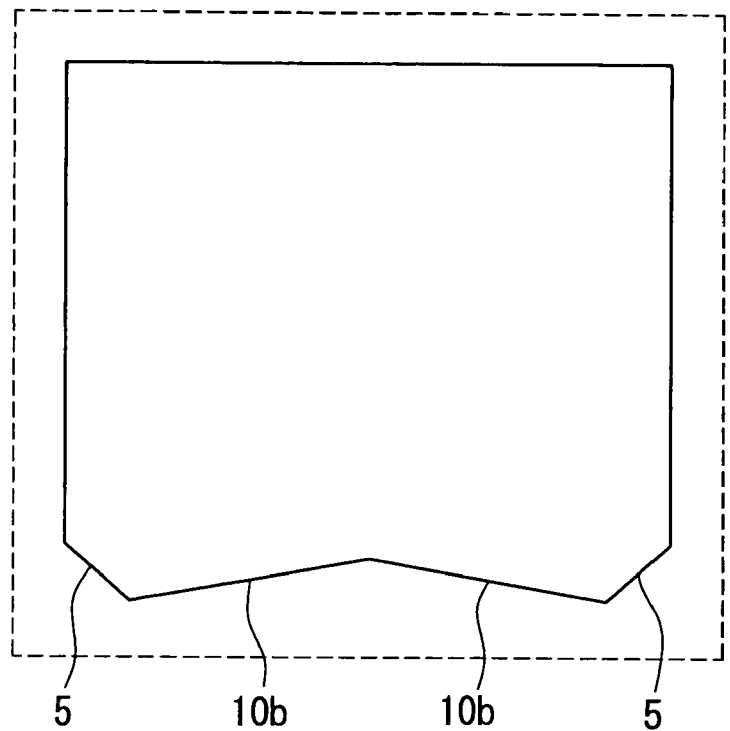
FIG. 29 is a top view showing an optical guide according to a fifth variation of the first embodiment.

FIG. 28 shows an optical guide where the arced surface 11b is replaced by a flat surface 10a in the optical guide shown in FIG. 27. FIG. 29 shows an optical guide where the arced surface 11a is replaced by a flat surface 10b in the optical guide shown in FIG. 26. Since a mold can be easily made for the manufacture of such an optical guide that has the flat surface, manufacturing cost can be reduced. Although the effect of total reflection achieved by employing the arced surface decreases, a non-observing region 3 outside of the effective light emitting region 1 can be decreased by properly designing the layout. The configuration having the flat surface such as shown in FIG. 29 may be preferred depending on the relationships between $\theta_1$, $\theta_2$ and $\theta_3$ and the refractive index.

Figure 30:
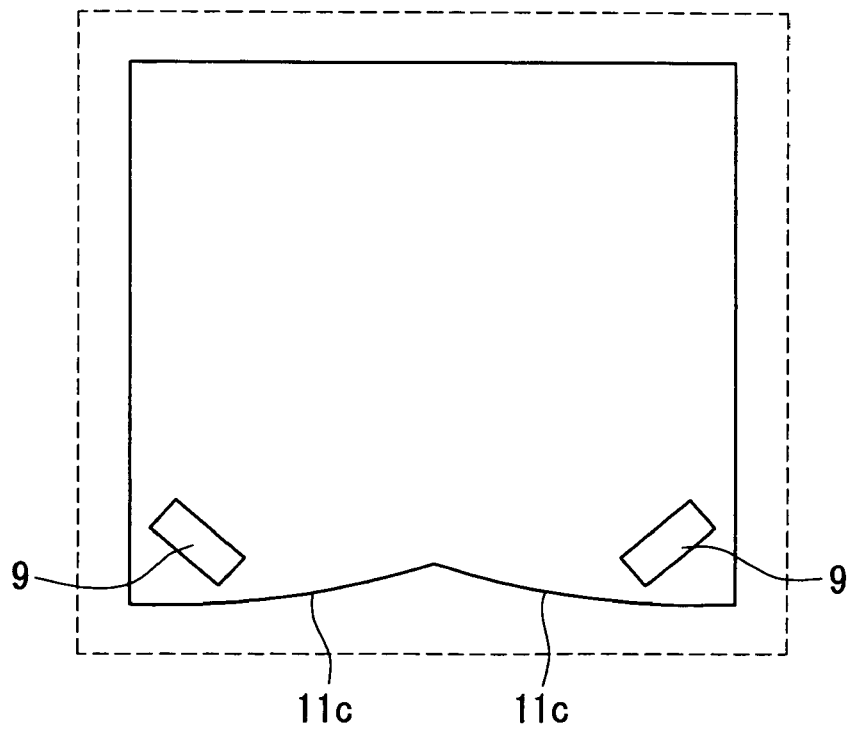
FIG. 30 is a top view showing an optical guide according to a sixth variation of the first embodiment.
Figure 31:
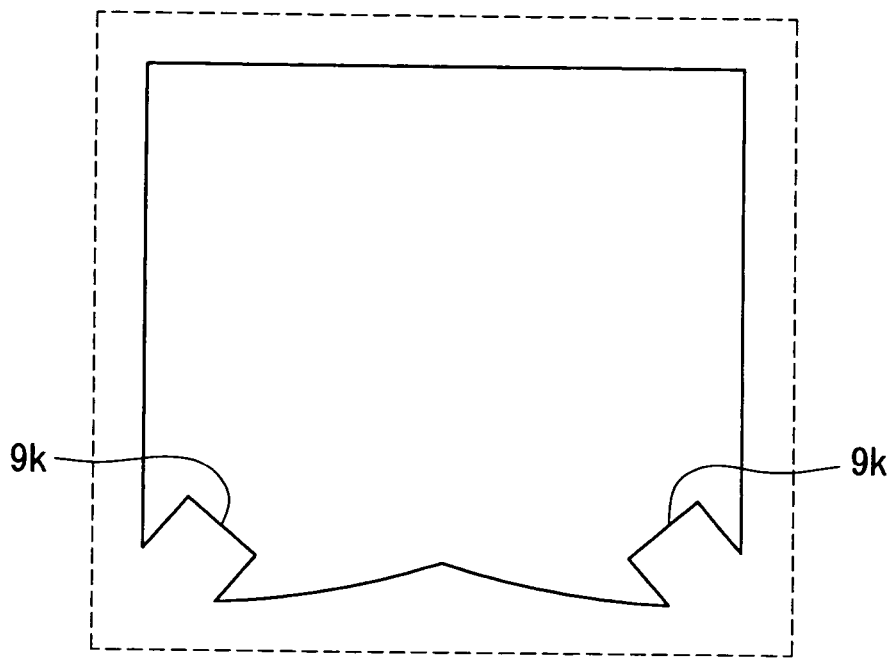
FIG. 31 is a top view showing an optical guide according to a seventh variation of the first embodiment.

FIG. 30 is a top view of an optical guide where light emitting diodes are disposed in through holes 9 that are formed at the corners of the optical guide. By incorporating the light emitting diode within the optical guide, it is made possible to introduce light emitted by the light emitting diode into the optical guide without leaking. For example, as shown in FIG. 30, through holes 9 having a shape of rectangular slit when viewed from the light emerging surface are formed at the corners. FIG. 31 shows an optical guide where the light introducing surface is constituted from the side face formed by cutting a notch 9k in the corner. This configuration also achieves an effect similar to that shown in FIG. 30 where the light emitting diodes are disposed in through holes that are formed at the corners of the optical guide.

According to the present invention, circumferential configuration of the optical guide is not limited to rectangle and may be trapezoid.

Second Embodiment

The optical guide of the second embodiment has the light emerging surface formed to have the circumferential configuration of trapezoidal shape (FIG. 14 through FIG. 24).

In the optical guide of the second embodiment, corners through which light from the light emitting diode is introduced is constituted similarly to the first embodiment, so that the light emitting surfaces of the light emitting diode face at a predetermined angle. In the second embodiment, the light emerging surface of the optical guide is not required to have the exact shape of trapezoid. By forming the light emerging surface in trapezoidal shape, it is made possible to increase the efficiency of light emission from the effective light emitting region 1 of the optical guide. That is, according to the second embodiment, portion of light that has been wasted by escaping from the non-observing region 3 can be guided into the effective light emitting region 1. The optical guide of the second embodiment will now be described in detail below.

The optical guide of the second embodiment has the light emerging surface of which outline is formed in substantially trapezoidal shape, and has the light introducing section constituted similarly to the first embodiment provided at least one of the corners thereof. Specifically, in the optical guide of the second embodiment, the inclination angle $\theta_3$ of the light introducing section, angle $\theta_1$ and angle $\theta_2$ of the notch prism are set similarly to the first embodiment. While the light emerging surface of the optical guide of the second embodiment has trapezoidal shape, it has the effective light emitting region of rectangular shape provided therein, while the direction of longer side and the direction of shorter side are defined for the effective light emitting region of rectangular shape provided similarly to the case of the first embodiment. Specifically, the light introducing section provided in the side face of the corner has the reference light introducing surface 13 that guides light in direction of the center axis of light distribution, the first light diffusion surface 15 that guides the light in the direction of the longer side and the second light diffusion surface 17 that guides the light in the direction of the shorter side. In addition, the angle $\theta_2$ between the plane of extension 23 from the reference light introducing surface 13 and the second light diffusion surface 17 is made different from the angle $\theta_1$ between the plane of extension 23 from the reference light introducing surface 13 and the first light diffusion surface 15. This configuration enables it to freely set the directivity within the optical guide for the light emitted from the light source in accordance to the angle $\theta_1$ and angle $\theta_2$, thereby to make the optical guide achieve surface light emission with uniform intensity.

In the second embodiment, too, the angle $\alpha$ between the center axis of light distribution and the longer side of the effective light emitting region is determined so as to divide the effective light emitting region into two equal parts, and accordingly the angle $\theta_1$ between the reference surface of the notch prism and the first light diffusion surface 15 and the angle $\theta_2$ between the reference surface and the second light diffusion surface 17 are determined.

As a result, in case the first side is the longer side, angle $\theta_1$ is set to an optimum value smaller than angle $\theta_2$ so that the region A and the region D in FIG. 1 emit light with the same luminance. In case the first side is the shorter side, $\theta_1$ is set to an optimum value smaller than angle $\theta_2$ so as to achieve surface light emission with uniform light intensity.

In the optical guide of the second embodiment, too, forming the side face of the optical guide in arced surface 11 makes it possible to improve the reflectivity of incident light on the arced surface and increase the area of the effective light emitting region. In the second embodiment, it is preferable that the in case the first side is the longer side, an angle is set to an optimum value smaller than angle $\theta_5$ between the arc that constitutes the arced surface and the line of extension of the side that forms the other side face is preferably an obtuse angle. This causes total reflection of the incident light on the arced surface 11 and enables it to prevent light from the optical guide from leaking.

Figure 15:
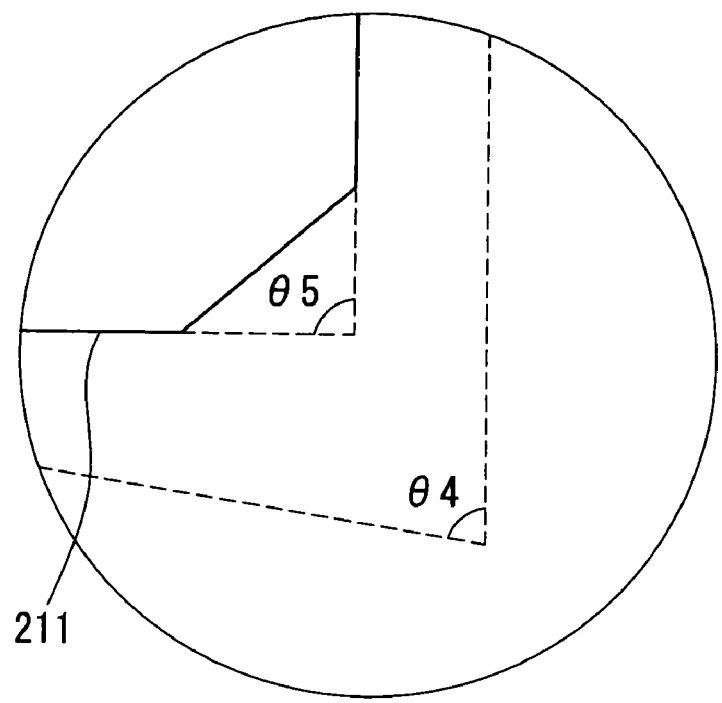
FIG. 15 is an enlarged top view of the corner shown in FIG. 14.

FIGS. 14 through 24 show various examples of the optical guide 200 according to the second embodiment, each having the light emerging surface of which outline has substantially trapezoidal shape with a partial modification applied. FIG. 14 shows the optical guide of which one of the side faces on the side of the longer side of rectangle is formed in an arced surface 211. FIG. 15 is a top view showing enlarged portion of corner of the optical guide shown in FIG. 14. This configuration enables it to totally reflect the light incident on the optical guide by the arced surface 211 unlike the optical guide where the side face is flat, so as to increase the luminance on the light emitting surface, and also decrease the non-observing region. Thus the optical guide of this embodiment is capable of achieving light emission with uniform and high luminance on the light emerging surface.

Figure 16:
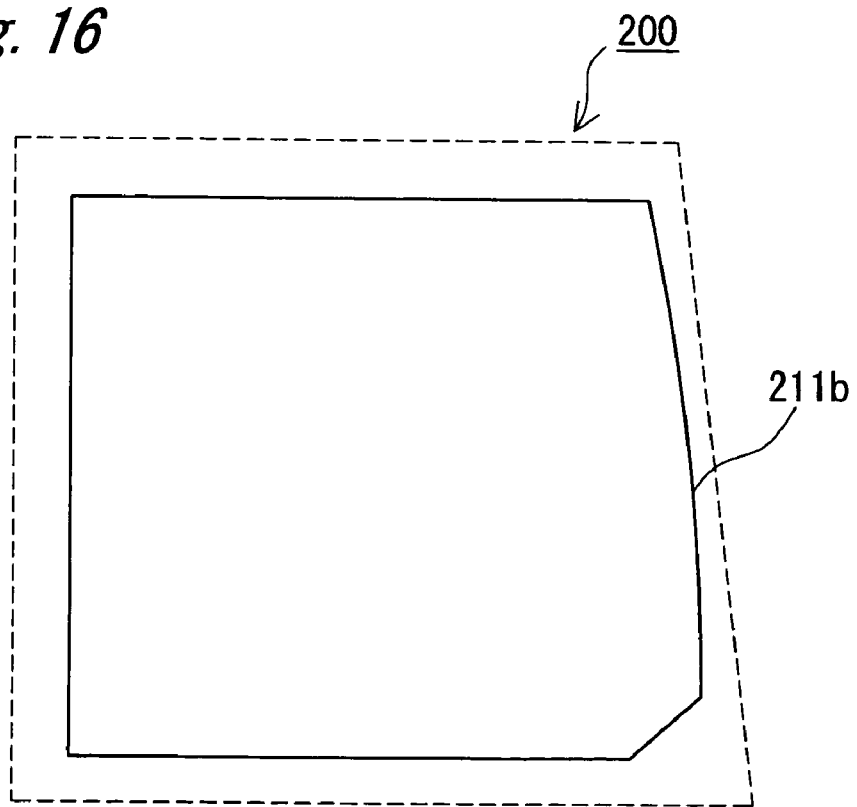
FIG. 16 is a top view showing a second example of the optical guide according to the second embodiment.
Figure 17:
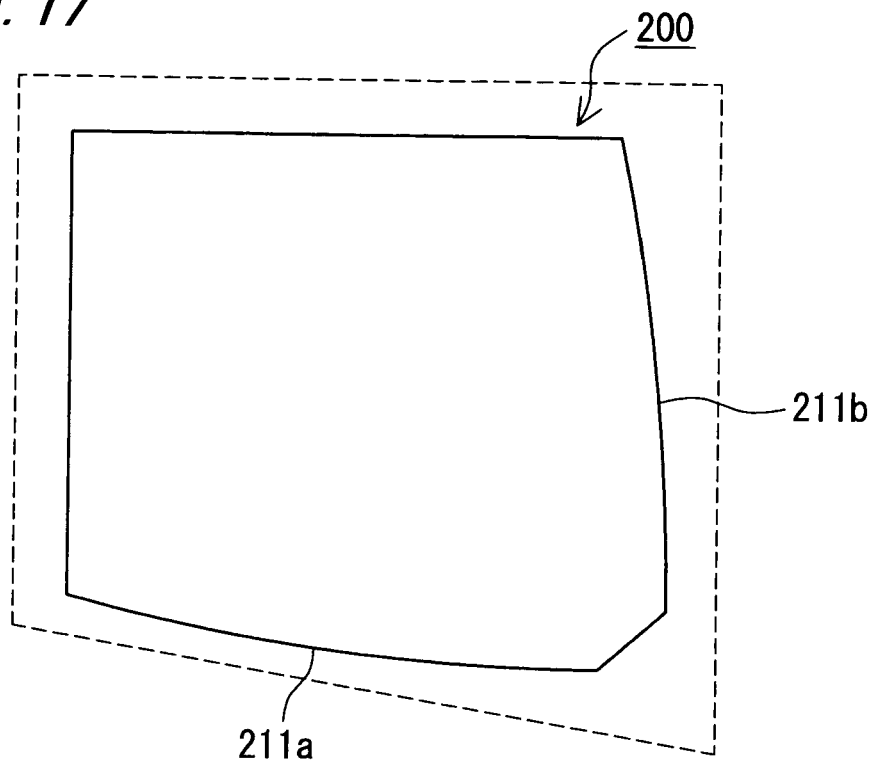
FIG. 17 is a top view showing a third example of the optical guide according to the second embodiment.

The optical guide of this embodiment is not limited to such a constitution where the side extending from the corner in the direction of the longer side is formed in an arc. For example, FIG. 16 shows the optical guide 200 that has the arced surface 211 formed from the arc extending from the corner in the direction of longer side of the rectangle. FIG. 17 shows the optical guide 200 that has arced surfaces 211a, 211b formed from arcs extending from the corner in the direction of longer side and in the direction of shorter side of the rectangle. By forming the arced surfaces on the optical guide, light emission with uniform and high luminance can be achieved on the light emerging surface.

Figure 18:
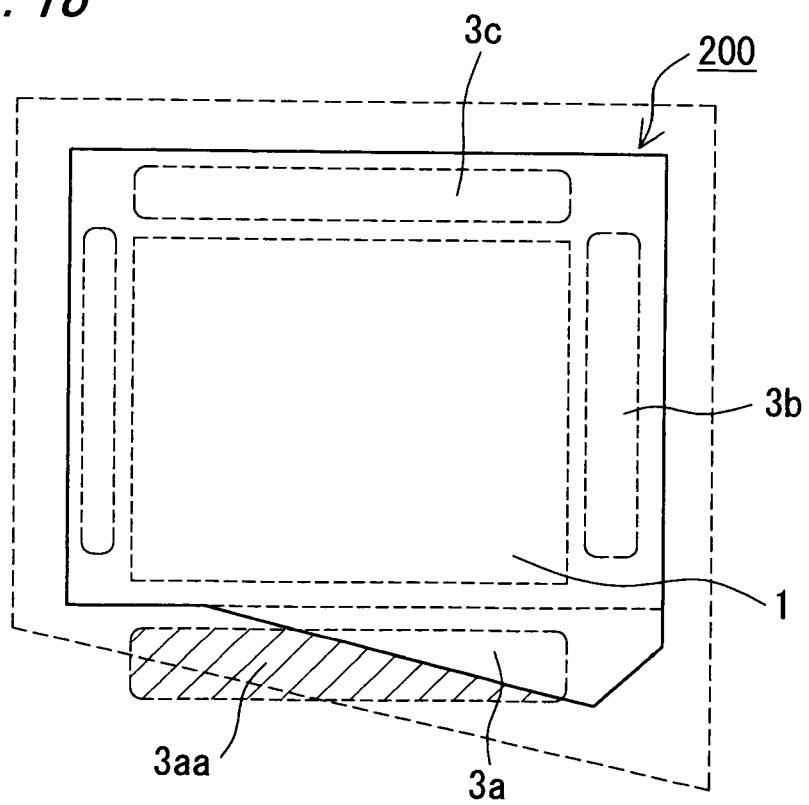
FIG. 18 is a top view showing a fourth example of the optical guide according to the second embodiment.
Figure 19:
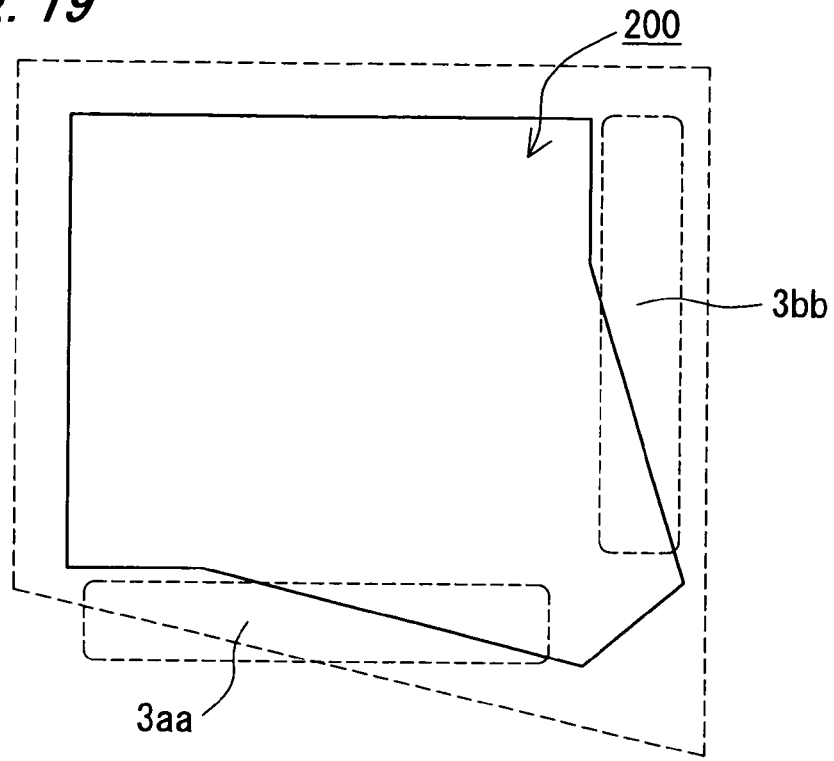
FIG. 19 is a top view showing a fifth example of the optical guide according to the second embodiment.

According to this embodiment, the optical guide can have such a constitution as one or two non-observing region is removed. That is, one or two side faces of the optical guide and the corresponding side of the effective light emitting region may be made coincide with each other. The non-observing region to be removed may be either one of two sides that extend from the corner of the optical guide 200. For example, FIG. 18 shows the optical guide 200 where the non-observing region 3aa is removed from the non-observing region 3a on the side of longer side of rectangle and the external edge thereof is formed from straight line. For example, FIG. 19 shows the optical guide where the non-observing region 3aa is removed from the non-observing region 3a on the side of longer side, the non-observing region 3bb is removed from the non-observing region 3b and the external edge thereof is formed from straight line.

Figure 20:
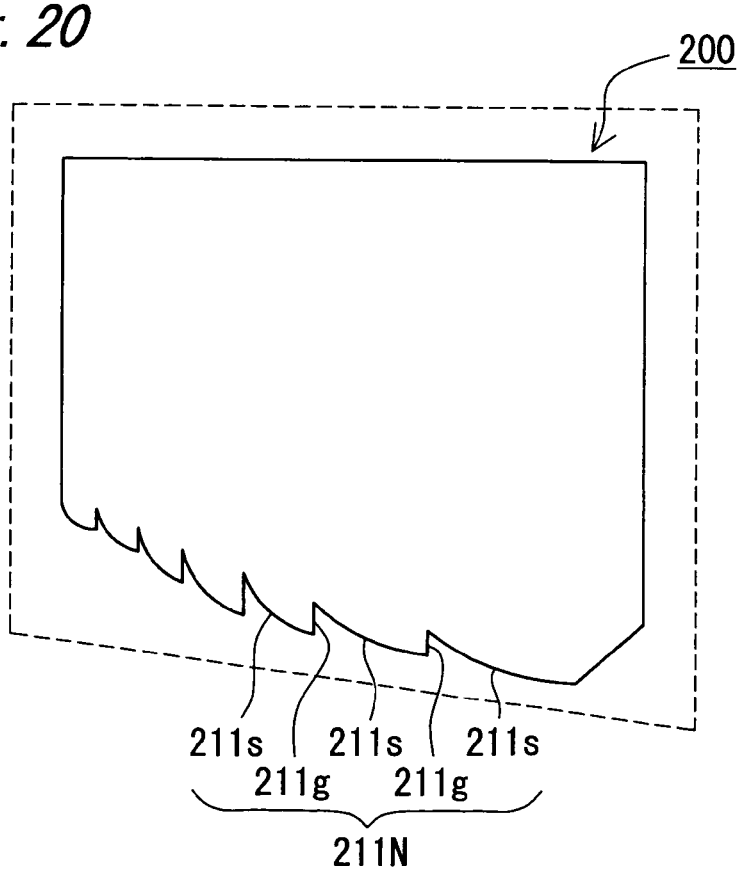
FIG. 20 is a top view showing a sixth example of the optical guide according to the second embodiment.
Figure 21:
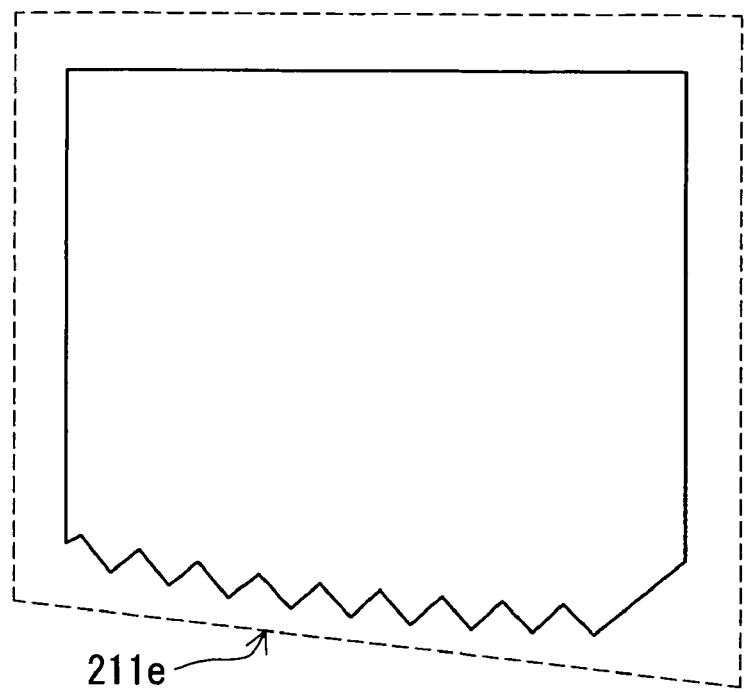
FIG. 21 is a top view showing a seventh example of the optical guide according to the second embodiment.
Figure 22:
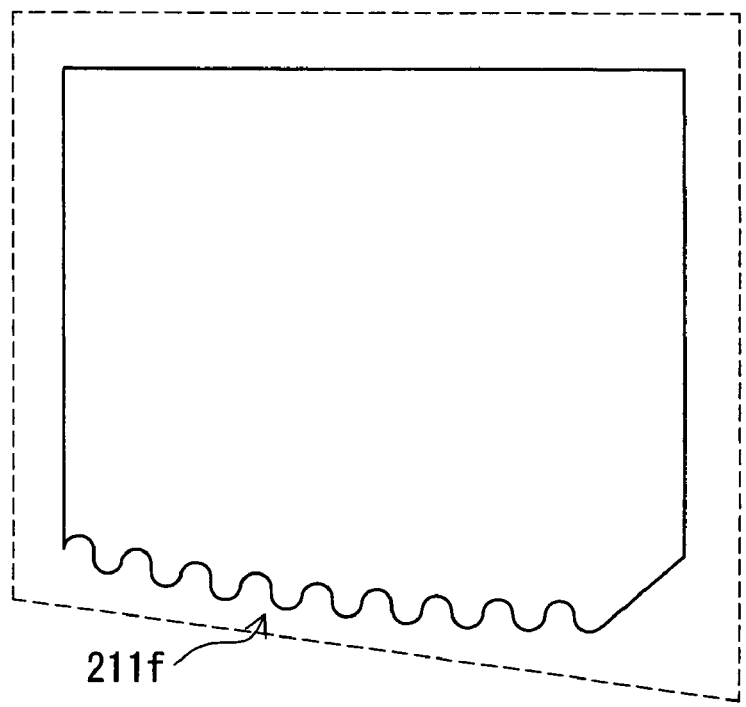
FIG. 22 is a top view showing an eighth example of the optical guide according to the second embodiment.
Figure 23:
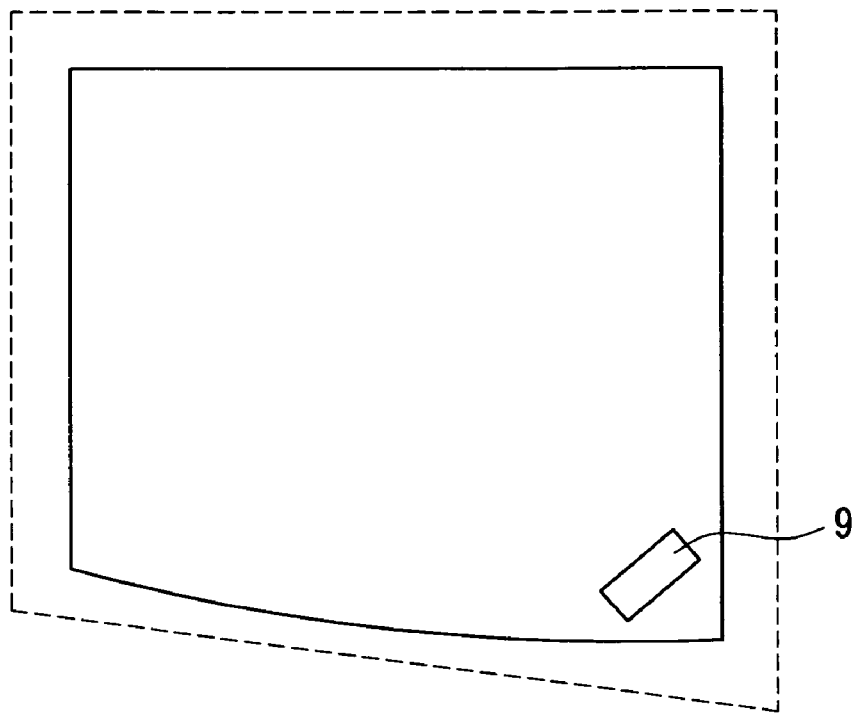
FIG. 23 is a top view showing a ninth example of the optical guide according to the second embodiment.
Figure 24:
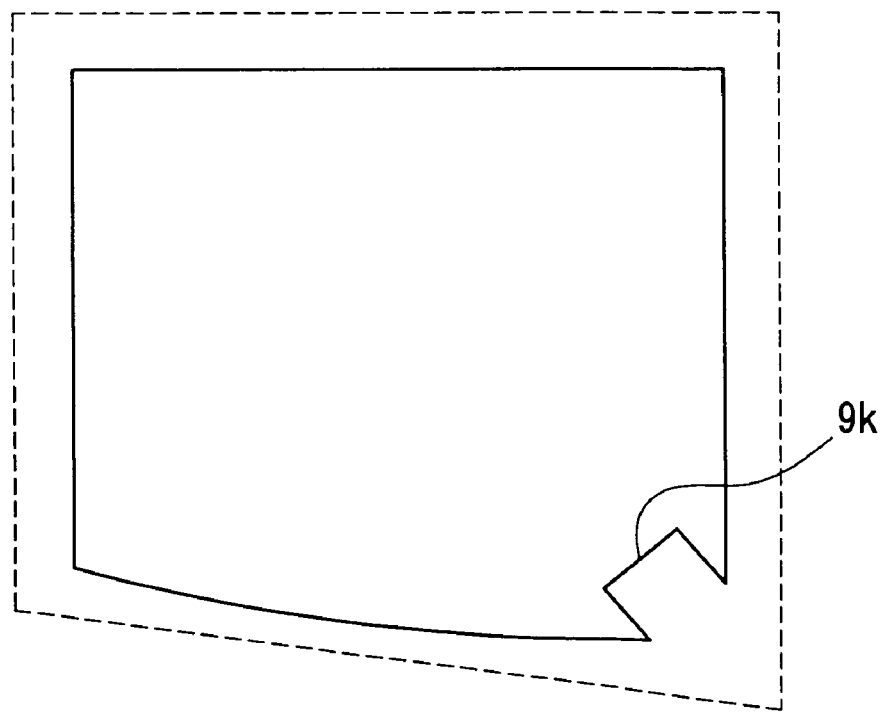
FIG. 24 is a top view showing a tenth example of the optical guide according to the second embodiment.

FIG. 20 shows a case where a saw-teeth shaped side face 211N is formed from a plurality of small arced surfaces 211s and steps 211g located between the small arced surfaces, instead of the arced surface 211 of the optical guide shown in FIG. 14. The optical guide having such a configuration can effectively diffuse light toward the effective light emitting region 1 and emit light with more uniform light intensity. In order to achieve such an effect, the configuration shown in FIG. 20 is the most preferable, but the saw-teeth shaped side face 211E shown in FIG. 21 or the wavy surface 211W shown in FIG. 22 may also be employed.

Outline of the light emerging surface of this embodiment may have the shape of isosceles trapezoid. In a surface light emitting apparatus having two light sources, the light emerging surface having the shape of isosceles trapezoid achieves the most uniform surface light emission when considering the spread of light into the optical guide. The isosceles trapezoid, in this context, is not limited to the isosceles trapezoid in the exact sense of the word, but includes any shape that can be substantially regarded as isosceles trapezoid including such a case as the side is partially formed from an arc when viewed from the light emerging surface of the optical guide. In the optical guide having such a shape, the corner is provided in a direction where an acute angle is formed among the sides that form the apex of the isosceles trapezoid.

FIG. 32 through FIG. 35 show examples of applications of the optical guide where the light emerging surface has the shape of isosceles trapezoid. Dashed line in the drawings indicate the outline of the light emerging surface.

Figure 32:
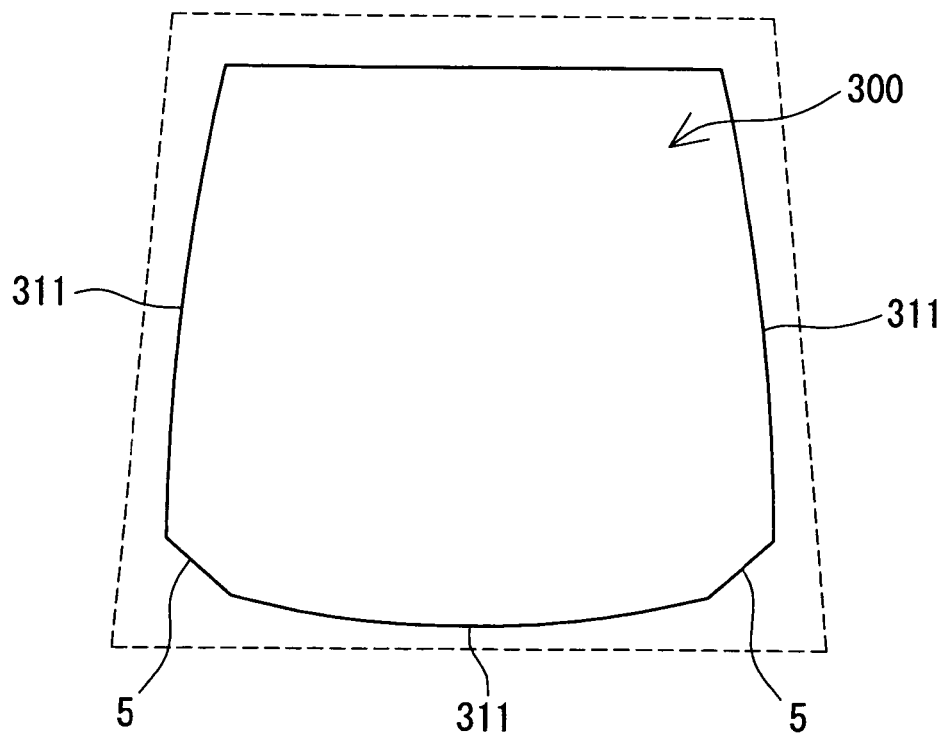
FIG. 32 is a top view showing an optical guide according to a first variation of the second embodiment.
Figure 33:
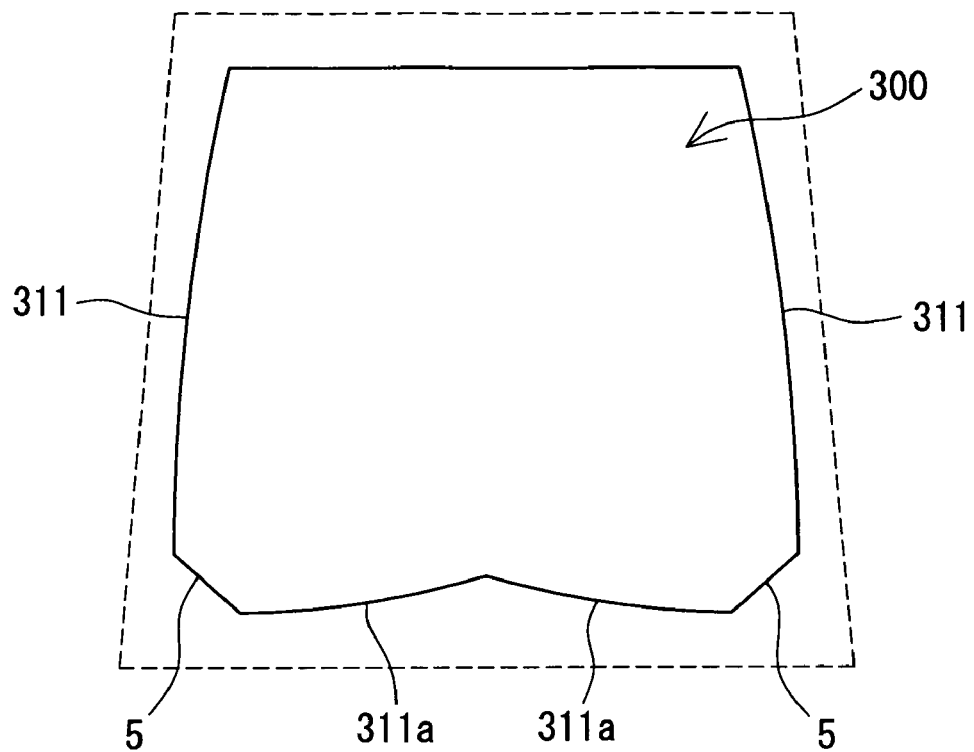
FIG. 33 is a top view showing an optical guide according to a second variation of the second embodiment.
Figure 34:
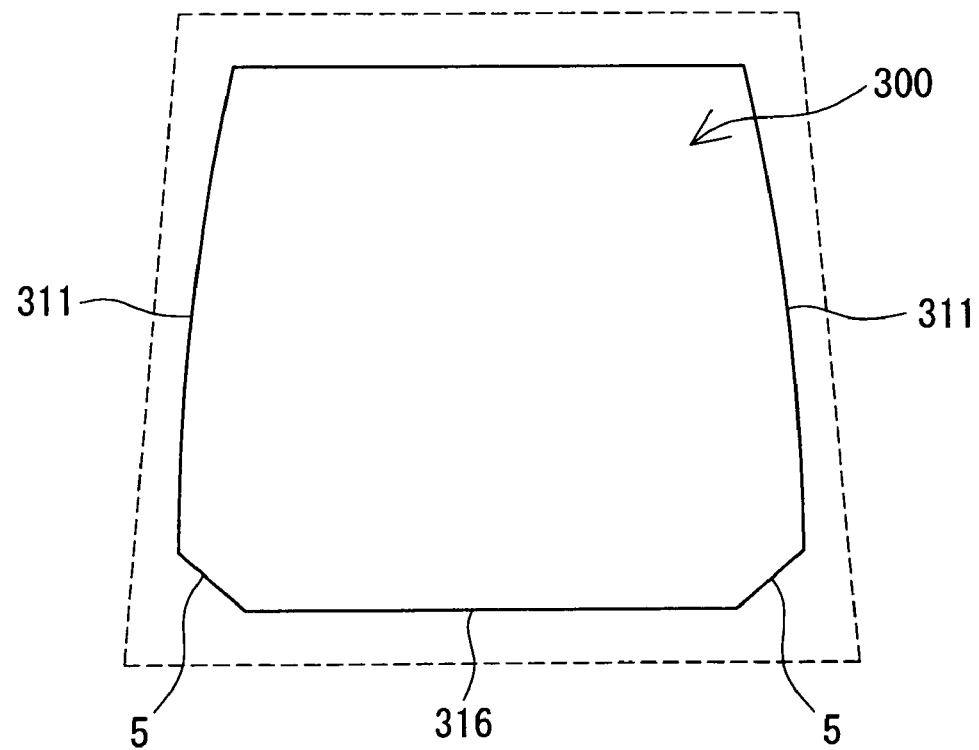
FIG. 34 is a top view showing an optical guide according to a third variation of the second embodiment.
Figure 35:
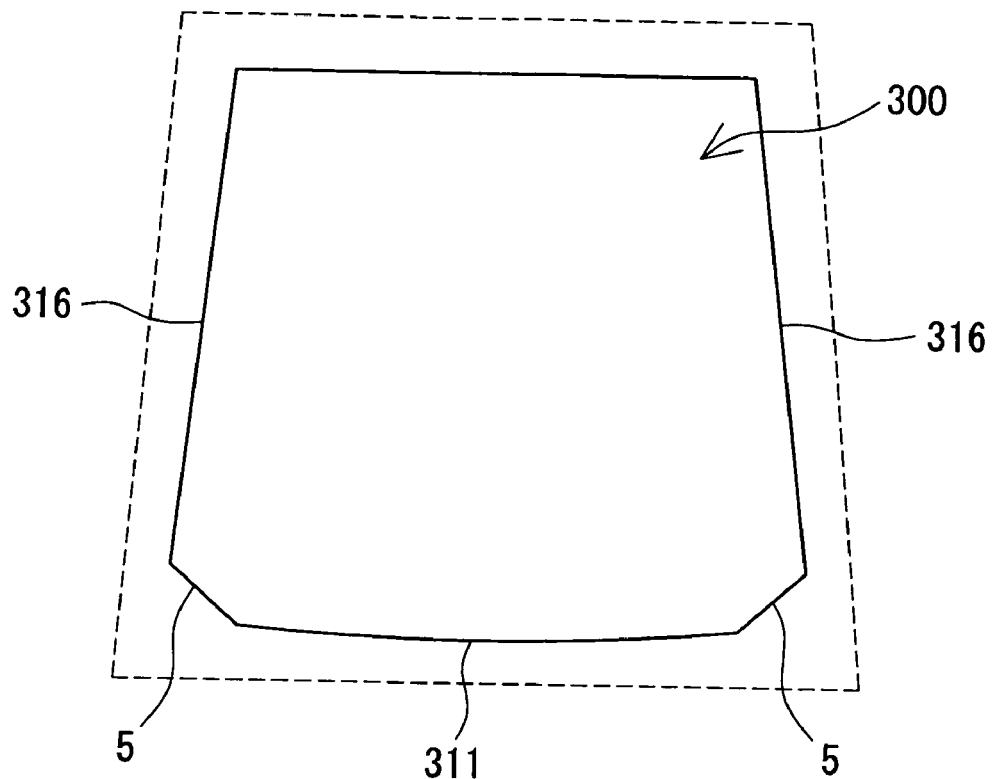
FIG. 35 is a top view showing an optical guide according to a fourth variation of the second embodiment.

FIG. 32 shows the optical guide 300 where two sides extending from corners that adjoin each other, where the light introducing section is formed, are formed in arcs. That is, in the optical guide 300 shown in FIG. 32, two sides extending from the corners that adjoin each other are formed in arced surfaces 311. FIG. 33 shows the light emerging surface where two sides extending from the corners 5 that adjoin each other are formed are formed in arcs, and one of the arcs is constituted from a plurality of arcs 311a. FIG. 34 shows the light emerging surface where one side interposed by the corners 5 that adjoin each other is formed in straight line and two sides that oppose each other on both sides of the straight line are formed in arcs. FIG. 35 shows the light emerging surface where one side interposed by the corners 5 that adjoin each other is formed in arc 311 and two sides that oppose each other on both sides of the arc 311 are formed in flat surface 316.

Third Embodiment

Figure 36:
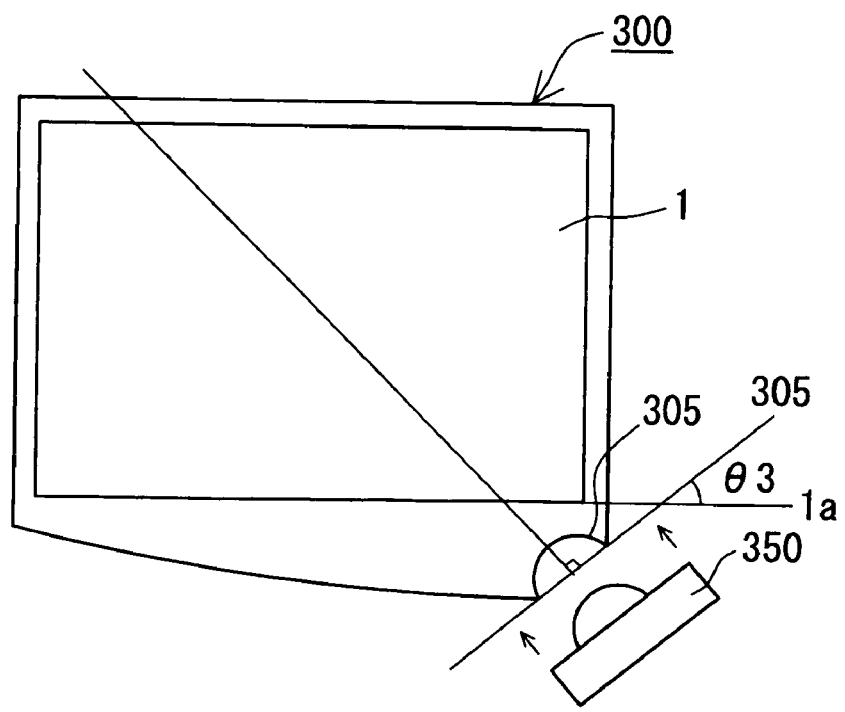
FIG. 36 is a top view showing an optical guide according to a third embodiment of the present invention.

FIG. 36 is a top view of the optical guide 300 of the third embodiment viewed from the side of the light emerging surface. The optical guide 300 of the third embodiment has the effective light emitting region 1 having longer side and shorter side included in the light emerging surface similarly to the first embodiment, but has the light introducing section of structure different from that of the first embodiment. That is, in the optical guide of the third embodiment, the light introducing section 305 that includes semi-circular notch formed in at least one corner is provided instead of the light introducing section that includes the notch, wherein uniform light emission in the effective light emitting region 1 is maintained by setting the diameter and center angle of the semi-circular shape of the notch and the direction of the center axis of light distribution in accordance to the directivity of the light emitting diode.

A method for setting the diameter and center angle of the semi-circular shape of the notch and the direction of the center axis of light distribution in the third embodiment will now be described below.

First, the reference plane 305 that corresponds to the reference plane 5 of the first embodiment is defined as a plane that passes both ends of the semi-circular notch (FIG. 36). Based on this definition, a straight line that passes the center of the semi-circular notch and is perpendicular to the reference plane 305 becomes the center axis of light distribution of the light introducing section.

Based on the definition described above, inclination angle $\theta_3$ between the reference plane 305 and the first side 1a is set so that the area of the effective light emitting region 1 is divided into roughly equal two parts by the center axis of light distribution, thereby dividing the area of the effective light emitting region 1 into two parts by the center axis of light distribution.

The center axis of light distribution is the axis to coincide with the axis of symmetry of the intensity of distribution of light (directivity pattern) emitted from the light source when the light source is disposed, as described in conjunction with the first embodiment.

Once the direction of the center axis of light distribution is determined, the diameter and center angle of the semi-cylindrical shape of the notch are set according to the profile of the light source and the directivity characteristic of the light source, so that uniform luminance of light emission within the effective light emitting region 1 is achieved.

Optimum directivity can be achieved within the optical guide of the third embodiment having such a constitution as described above, by changing the inclination angle $\theta_3$ in the optical guide, the diameter and center angle of the semi-cylindrical shape of the notch, while taking into consideration the directivity of the light source, thus making it possible to achieve uniform surface light emission.

While the optical guide 300 of the third embodiment may be used in combination with various light sources, it is preferably used in combination with a light source that has a semi-cylindrical lens shown in FIG. 37.

Figure 38:
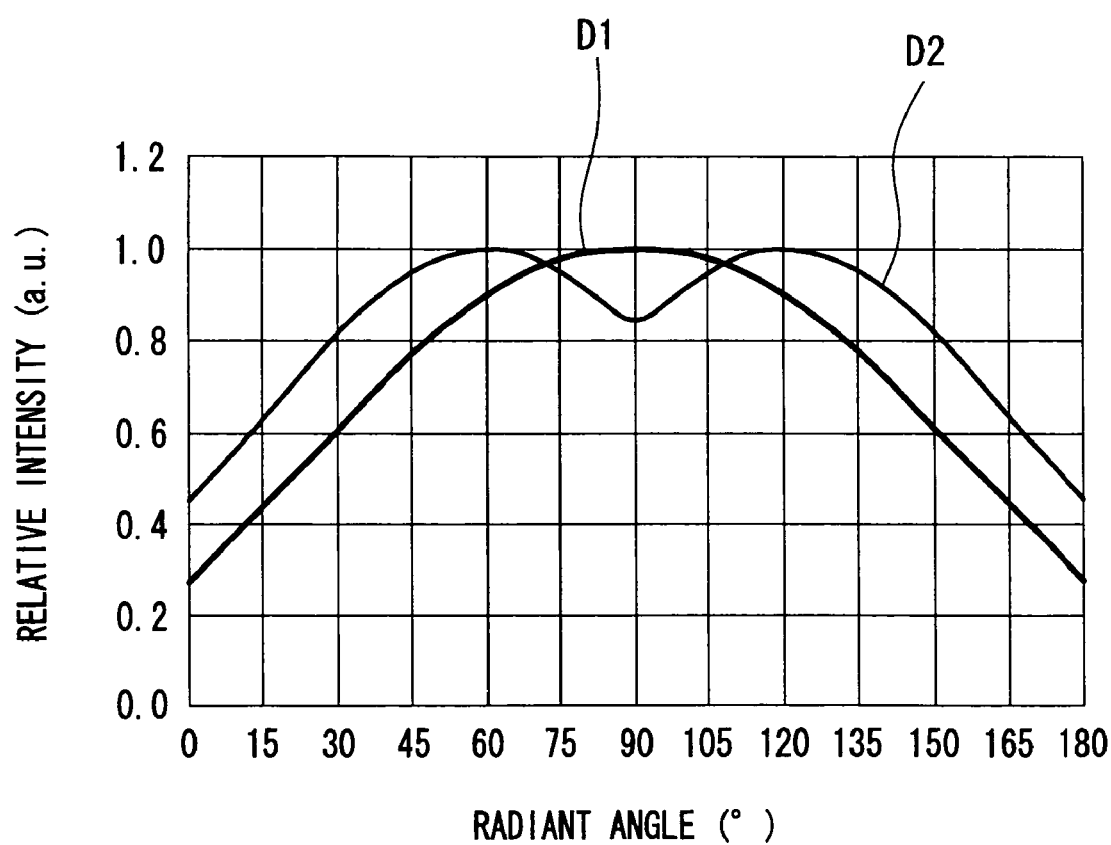
FIG. 38 is a diagram showing the directivity of the light emitting diode shown in FIG. 37.

The light source shown in the perspective view of FIG. 37 comprises a first transparent resin layer 362 including a fluorescent material dispersed therein, and a second transparent resin layer 364 that covers substantially the entire surfaces of the first transparent resin layer 362 and of an insulating substrate 352 are formed successively on top of the insulating substrate 352 that has substantially rectangular parallelepiped shape, so as to realize the light emission characteristics shown in FIG. 38 by means of the configurations.

Specifically, the light emitting diode 358 mounted on the insulating substrate 352 is disposed in the first transparent resin layer 362. The first and second transparent resin layers 362, 364 have substantially cylindrical shapes that are coaxially disposed and the same width. The top surface of the first transparent resin layer 364 that serves as light emitting surface 364a is formed in convex curve so as to have the function of lens, thereby achieving the light emission characteristics shown in FIG. 38 that is axially symmetrical as described in the first embodiment. This light source produces light of desired color controlled by the fluorescent material dispersed in the first transparent resin layer 362.

The cylindrical notch of the optical guide that is combined with the light source 350 shown in FIG. 37 is preferably formed in a curved surface corresponding to the top surface of the first transparent resin layer 364, namely the light emitting surface 364a.

The optical guide of the third embodiment is characterized by the fact that the light introducing surface comprising a curved surface where the center axis of light distribution is set in a particular direction is provided at the corner as described previously, and many variations thereof can be conceived.

Figure 39:
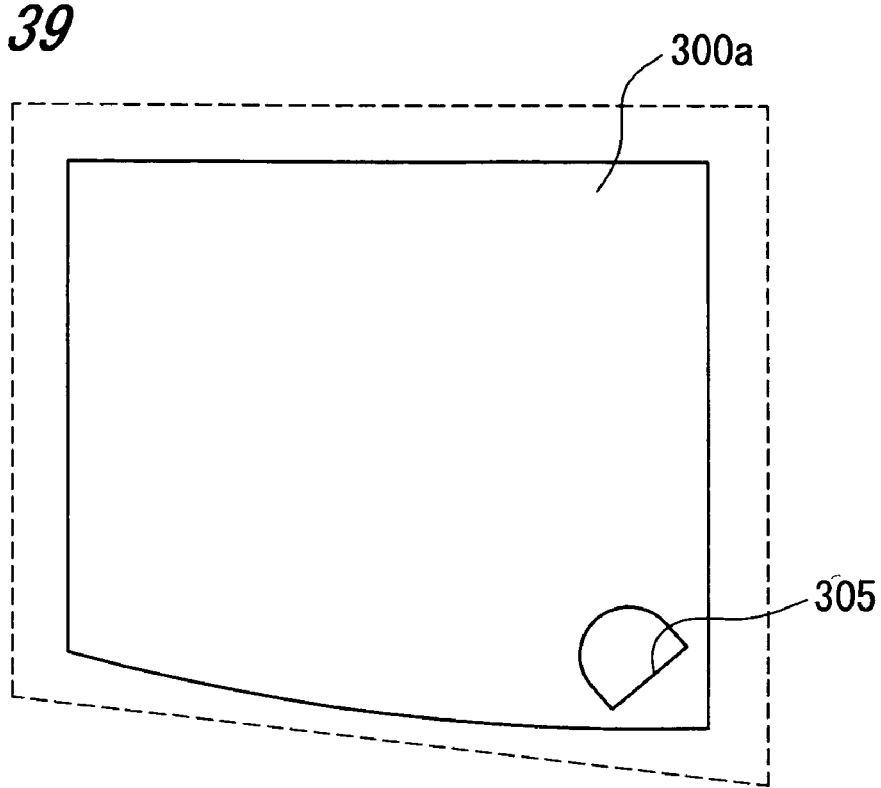
FIG. 39 is a top view showing an optical guide according to a first variation of the third embodiment.

FIG. 39 is a top view of the optical guide 300a according to a variation of the third embodiment.

This variation is different from the optical guide of the third embodiment in that the through hole in which the light source is disposed is provided so as to form the light introducing surface of semi-circular shape, with the constitution similar to that of the third embodiment with other respects.

In this variation, the reference plane is denoted by reference numeral 305 in FIG. 39.

Figure 40:
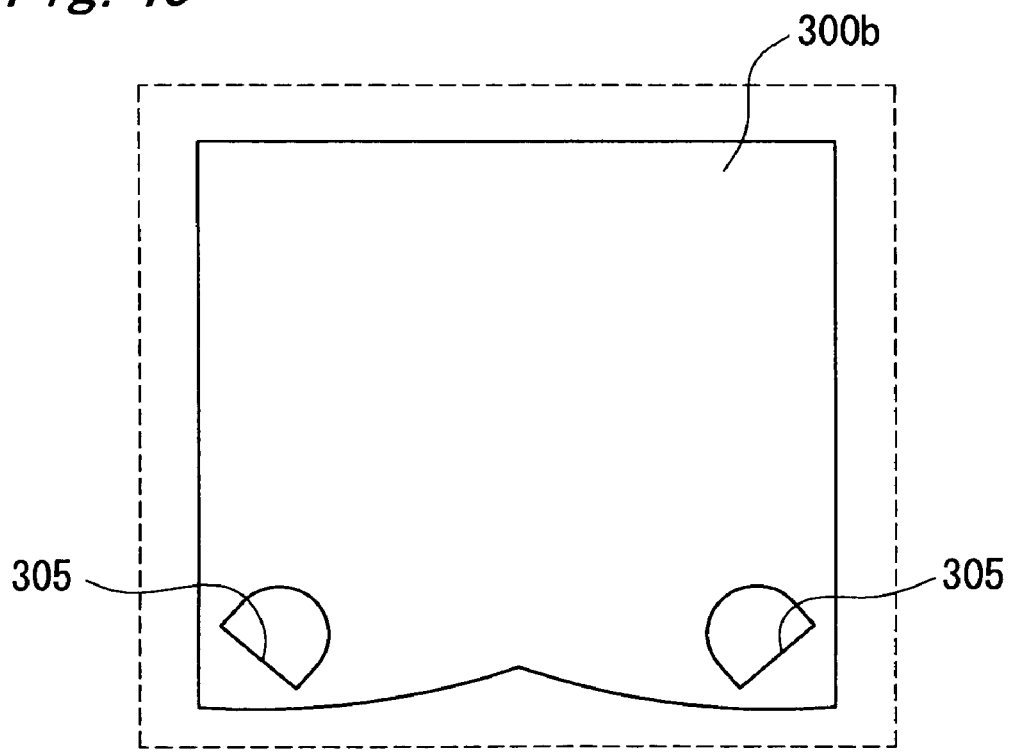
FIG. 40 is a top view showing an optical guide according to a second variation of the third embodiment.

FIG. 40 is a top view of the optical guide 300b according to another variation of the third embodiment, with the constitution being similar to that of the third embodiment shown in FIG. 39 except for providing two through holes in which the light sources are disposed.

The optical guide of the variation having the constitution described above also has an operation and effect similar to that of the third embodiment.

The optical guides of the embodiments described above may be formed from various materials such as acrylic resin, polycarbonate resin, amorphous polyolefin resin, polystyrene resin, norbornene resin or cycloolefin polymer (COP). The optical guide of this embodiment may be formed in various configurations such as plate or needle shape from these materials by various methods such as injection molding or transfer mold process.

An acrylic resin that is preferably used in forming the optical guide has higher transparency and less susceptibility to yellowing due to photo-deterioration than other resins. Accordingly, a surface light emitting apparatus that employs the optical guide formed from acrylic resin is capable of emitting light over an extended period of time without undergoing chronic decrease in optical output.

Polycarbonate resin has higher impact resistance than other resins. The surface light emitting apparatus of small size, among the surface light emitting apparatus of this embodiment, is used as the backlight for the liquid crystal display of a mobile telephone or the like. Thus polycarbonate resin that has high impact resistance is preferably used in this application.

In the surface light emitting apparatus comprising the optical guide of the embodiment described above and a light source, the light emitting diode that is used preferably as the light source is preferably such as an LED chip molded in a bullet shape or mounted in a surface mount package (SMD type). Among SMD type packages, side view (SV) type package is preferably used since it enables it to form a low-profile surface light emitting apparatus. A plurality of light emitting diode may also be disposed at one corner of the optical guide. Such a light source may also be used as a plurality of light emitting diodes that emit light of arbitrary colors are provided.

The light emitting diode may be provided with at least an LED chip and a fluorescent material that converts light emitted by the LED chip to light of difference wavelength. Efficiency of light emission by the fluorescent material becomes higher when it converts light emitted by the LED chip to light of longer wavelength. The light emitting diode in this embodiment may be such that emits light by blending light emitted by the LED chip and light emitted by the fluorescent material. The blended light is preferably of white color. The light emitting diode that produces blended light of white color can be used to constitute the surface light emitting apparatus that is applied for full-color display.

The fluorescent material preferably has median particle size in a range from 6 to 50 µm, and more preferably from 15 to 30 µm. The fluorescent material having such particle size is preferable because it has high absorptivity of light and high efficiency of wavelength conversion and can be excited by light of wider range of wavelengths. Fluorescent material having particle size smaller than 6 µm tends to coagulate and thereby to form a dense material and precipitate in a liquid resin, thus decreasing the permeability to light. A fluorescent material of small particle size also has low absorptivity of light and low efficiency of wavelength conversion, and can be excited only by light of narrower range of wavelengths.

The fluorescent material of this embodiment is preferably based on yttrium aluminum oxide fluorescent material (YAG fluorescent material) activated by cerium (Ce) or praseodymium (Pr) that is excited by light emitted by the LED which has a light emitting layer formed from nitride semiconductor and emits light. Specifically, $YAlO_3$:Ce, $Y_3Al_5O_{12}$:Ce (YAG: Ce), $Y_4Al_2O_9$:Ce or a mixture thereof may be used. The yttrium aluminum oxide fluorescent material preferably includes at least one kind of Ba, Sr, Mg, Ca and Zn. Including Si makes it possible to suppress the reaction that grows crystal and control the fluorescent material particles with less variation. More particularly, photoluminescence fluorescent material represented by general formula of $(Y_zGd_{1-z})_3Al_5O_{12}$:Ce ($0<Z\leqq1$), or photoluminescence fluorescent material represented by general formula of $(Re_{1-a}Sm_a)_3Re'_5O_{12}$:Ce ($0\leqq a<1$, $0\leqq b\leqq1$, Re is at least one kind selected from among Y, Gd, La and Sc, and Re' is at least one kind selected from among Al, Ga and In) may be used. In addition to Ce, such elements as Tb, Cu, Ag, Au, Fe, Cr, Nd, Dy, Co, Ni Ti and Eu may also be included as required.

In the light emitting diode of this embodiment, the photoluminescence fluorescent material may comprise two or more kinds of yttrium aluminum garnet-based fluorescent material activated with cerium or other fluorescent material being mixed. By mixing two or more kinds of yttrium aluminum garnet-based fluorescent material having different proportions of Y substituted with Gd, it is made possible to easily produce light of desired color tone.

Examples of the present invention will now be described. It goes without saying that the present invention is not limited to the following Examples.

EXAMPLE 1

FIG. 14 is a top view showing the optical guide of this Example viewed from the side of the light emerging surface. The optical guide of this Example is formed from acrylic resin by injection molding process. The optical guide 100 of this Example has a principal surface having outline of trapezoidal shape, end faces provided on side faces disposed in the diagonal direction of the principal surface, the reference light introducing surface 13 provided in the direction of shorter side, the first light diffusion surface 15 provided in the direction of longer side and notches provided in the end faces.

Outline of the light emerging surface has a trapezoidal shape indicated by dashed line in the drawing. The effective light emitting region of rectangular shape indicated by the dashed line in FIG. 14 has dimensions of 40.54 mm in length of one side of the light emerging surface in the direction of the longer side and 35.2 mm in length of one side of the light emerging surface in the direction of the shorter side.

Angles $\theta_1$, $\theta_2$ and $\theta_3$ are 60°, 30° and 40°, respectively. The notch has a shape of triangular prism as shown in FIG. 8, and width of the notch is 150 μm. Light emitting surface of a side-view type light emitting diode measuring 2.8 mm in width, 1.2 mm in depth and 0.8 mm in height is disposed on the light introducing surface that has the notches as described above. The light emitting diode is driven to emit light by supplying current (If) of 20 mA with a voltage (Vf) of 3.6 V.

Abnormal light emission with localized bright spot was not observed in the light emerging surface of the surface light emitting apparatus of this Example that was constituted as described above, and luminance of about 1800 cd/m² was achieved in the effective light emitting region.

EXAMPLE 2

Outline of the light introducing surface of the optical guide of this Example has the shape shown in FIG. 14 similarly to Example 1. In this Example, length of the rectangle along the longer side is 48.14 mm and length of the rectangle along the shorter side is 33.65 mm. Angles $\theta_1$, $\theta_2$ and $\theta_3$ are 45°, 80° and 60°, respectively. With other respect, the optical guide is the same as that of Example 1. The surface light emitting apparatus constituted by using the optical guide of this Example shows optical characteristic similar to that of Example 1.

INDUSTRIAL APPLICABILITY

The present invention can be applied to backlight that is under pressing requirement for smaller size and less space requirement.

What is claimed is:

1. An optical guide comprising:
    a first principal surface that has an effective light emitting region of substantially rectangular shape surrounded by first through fourth sides, the first side being longer than the second side; and
    a second principal surface that opposes the first principal surface, wherein
        a circumferential side face of the optical guide includes first through fourth side faces disposed along the first through fourth sides, respectively, and a light introducing section, disposed at the corner interposed between the first and second side faces, with an angle of inclination from the first side face that is determined so that center axis of light distribution intersects one of the first through fourth sides and divides the area of the effective light emitting region into two equal parts, and
        the light introducing section has notches comprising a first light diffusion surface that directs an incident light in a direction of the first side and a second light diffusion surface that directs an incident light in a direction of the second side, where angle $\Theta_1$ between a reference plane perpendicular to the center axis of light distribution and the first light diffusion surface and angle $\Theta_2$ between the reference plane and the second light diffusion surface are different so that an area of the first light diffusion surface is larger than an area of the second light diffusion surface.

2. The optical guide according to claim 1, wherein the notches are shaped as a triangular prism or a triangular pyramid.

3. A surface emitting device comprising the optical guide according to claim 1 and a point light source which is optically connected to the optical guide.

4. The surface emitting device according to claim 3, wherein the point light source includes a light emitting diode having an LED chip and a fluorescent material that converts light from the LED chip to light of a different wavelength.

* * * * *